United States Patent
Sonoyama et al.

(10) Patent No.: US 8,604,690 B2
(45) Date of Patent: Dec. 10, 2013

(54) ORGANIC EL DEVICE, ELECTRONIC APPARATUS, AND METHOD FOR MANUFACTURING ORGANIC EL DEVICE

(75) Inventors: Takuya Sonoyama, Suwa (JP); Hideyuki Kimura, Chichibu (JP)

(73) Assignee: Seiko Epson Corporation, Tokyo (JP)

( * ) Notice: Subject to any disclaimer, the term of this patent is extended or adjusted under 35 U.S.C. 154(b) by 591 days.

(21) Appl. No.: 12/428,097

(22) Filed: Apr. 22, 2009

(65) Prior Publication Data

US 2009/0278450 A1 Nov. 12, 2009

(30) Foreign Application Priority Data

May 8, 2008 (JP) ................................. 2008-121926

(51) Int. Cl.
H01J 1/62 (2006.01)
H01J 63/04 (2006.01)
H01J 9/00 (2006.01)
H01J 9/24 (2006.01)

(52) U.S. Cl.
USPC ............................................ 313/506; 445/24

(58) Field of Classification Search
USPC ................................ 313/498–512; 445/23, 24
See application file for complete search history.

(56) References Cited

U.S. PATENT DOCUMENTS

| | | | |
|---|---|---|---|
| 6,781,162 B2 | 8/2004 | Yamazaki et al. | |
| 7,265,391 B2 | 9/2007 | Yamazaki et al. | |
| 7,462,984 B2 | 12/2008 | Handa et al. | |
| 7,692,186 B2 | 4/2010 | Yamazaki et al. | |
| 7,834,539 B2 | 11/2010 | Handa et al. | |
| 8,089,066 B2 | 1/2012 | Yamazaki et al. | |
| 2002/0011783 A1* | 1/2002 | Hosokawa | 313/504 |
| 2005/0280364 A1* | 12/2005 | Omura et al. | 313/506 |
| 2007/0154733 A1 | 7/2007 | Fukuoka et al. | |
| 2007/0188084 A1* | 8/2007 | Fukuoka et al. | 313/506 |
| 2008/0042146 A1* | 2/2008 | Cok et al. | 257/79 |
| 2009/0066219 A1 | 3/2009 | Handa et al. | |

FOREIGN PATENT DOCUMENTS

| | | |
|---|---|---|
| JP | A-2002-252087 | 9/2002 |
| JP | A-2003-288994 | 10/2003 |
| JP | A-2004-296437 | 10/2004 |
| JP | A-2006-236916 | 9/2006 |
| JP | A-2007-128741 | 5/2007 |
| WO | WO 2005/086540 A1 | 9/2005 |
| WO | WO2006087658 * | 8/2006 |
| WO | WO 2007/041116 A1 | 4/2007 |

* cited by examiner

Primary Examiner — Anh Mai
Assistant Examiner — Zachary J Snyder
(74) Attorney, Agent, or Firm — Oliff & Berridge, PLC

(57) ABSTRACT

A top emission organic EL device includes a substrate; a reflective layer formed on the substrate; a transparent first electrode formed on the reflective layer; a functional layer containing an organic light-emitting layer and formed on the transparent first electrode; a transparent second electrode formed on the functional layer; an optical length adjustment layer formed on the transparent second electrode; and a transflective layer formed on the optical length adjustment layer. In the organic EL device, an optical resonator is formed between the reflective layer and the transflective layer.

16 Claims, 18 Drawing Sheets

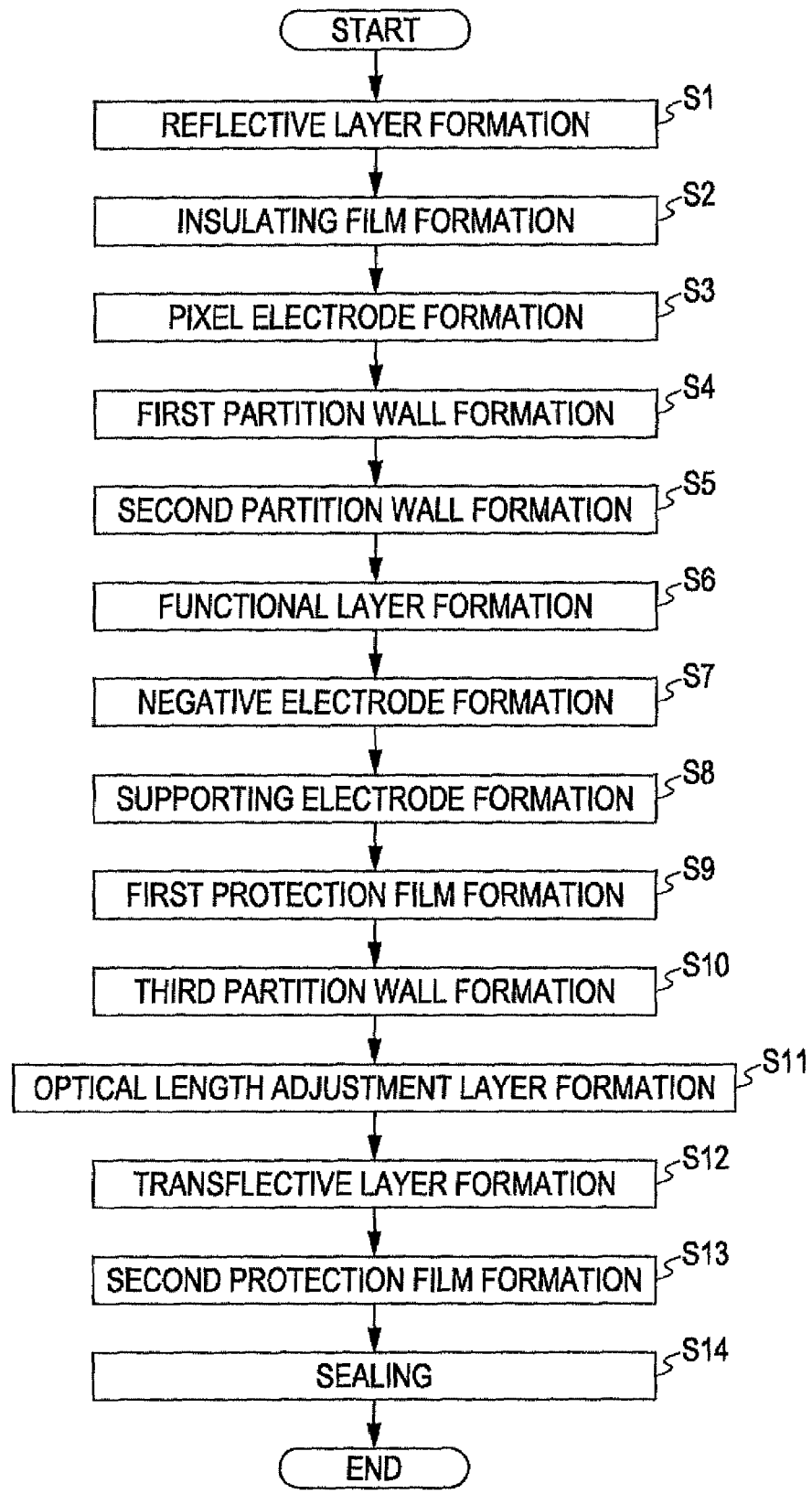

ORGANIC EL DEVICE, ELECTRONIC APPARATUS, AND METHOD FOR MANUFACTURING ORGANIC EL DEVICE

This application claims priority to Japanese Patent Application No. 2008-121926, filed in Japan on May 8, 2008, the entire disclosure of which is expressly incorporated by reference herein.

BACKGROUND

1. Technical Field

The present invention relates to an organic electroluminescent (EL) device including an organic EL element as a light-emitting element, an electronic apparatus, and a method for manufacturing the organic EL device.

2. Related Art

An organic light-emitting display is known as an organic EL device (refer to JP-A-2002-252087). The organic light-emitting display includes an organic light-emitting element having a first transparent electrode, a light-emitting layer, and a second transparent electrode; and a drive layer having a switching element that controls the organic light-emitting element. In the organic light-emitting display, a reflective film is disposed under an interlayer insulating film in the drive layer, and the reflective film is positioned outside the first transparent electrode.

The organic light-emitting display has an optical resonance structure in which light that is directly emitted to the second transparent electrode side from the light-emitting layer resonates with light that is emitted from the light-emitting layer and then reflected by the reflective film to increase luminance. In this optical resonance structure, the distance between the light-emitting layer and the reflective film is set in accordance with an emission color in the light-emitting layer, that is, a wavelength of light, to improve the luminance of each emission color.

Furthermore, an organic EL light-emitting apparatus is known as an organic EL device (refer to JP-A-2007-128741). In the organic EL light-emitting apparatus, an element substrate on which a plurality of light-emitting elements including a functional layer with an organic light-emitting layer are formed is bonded through an adhesive layer to a sealing substrate on which color elements corresponding to the plurality of light-emitting elements are formed. The organic EL light-emitting apparatus includes color filters as the color elements that correspond to emission colors, and achieves brighter color expression by correcting the chromaticity of the emission colors using the color filters.

In the existing organic light-emitting display and organic EL light-emitting apparatus described above, since the light-emitting layer is formed on the first transparent electrode, a desired optical resonance structure is sometimes not achieved if the thickness of the light-emitting-layer varies. In addition, when the sealing substrate on which the color filters are formed and the element substrate on which the functional layer is formed are bonded together, a light-emitting region needs to be aligned with a colored region of the color filters with high positional accuracy when viewed in plan. Otherwise, the correction of the chromaticity may be inappropriately conducted due to the leakage of light.

SUMMARY

The invention can be achieved as the following embodiments or applicable examples.

Applicable Example 1

A top emission organic EL device according to this applicable example includes a substrate; a reflective layer formed on the substrate; a transparent first electrode formed on the reflective layer; a functional layer containing an organic light-emitting layer and formed on the transparent first electrode; a transparent second electrode formed on the functional layer; an optical length adjustment layer formed on the transparent second electrode; and a transflective layer formed on the optical length adjustment layer. In the top emission organic EL device, an optical resonator is formed between the reflective layer and the transflective layer.

In this structure, the first electrode, the functional layer, and the second electrode constitute an organic EL element, and the optical length adjustment layer and the transflective layer that form an optical resonator are stacked on the organic EL element. Thus, preferable resonance is achieved by adjusting the thickness of the optical length adjustment layer in accordance with the emitting state of the organic EL element. This can provide a top emission organic EL device having high luminance.

Applicable Example 2

The organic EL device according to the applicable example described above preferably further includes an at least one-color filter element corresponding to an emission color, the filter element being formed on the transflective layer. In this structure, the chromaticity of the emission color is corrected by disposing the at least one-color filter element on the optical resonator. This can provide a top emission organic EL device having excellent chromaticity balance and high luminance.

Applicable Example 3

The organic EL device according to the applicable example described above preferably further includes a protection film having gas impermeability, the protection film being disposed between the transflective layer and the at least one-color filter element. In this structure, the protection film having gas impermeability can prevent the entrance of a gas such as water vapor, which is emitted from the filter element, into the organic EL element through the transflective layer. In other words, the protection film prevents the organic EL element from being deactivated due to the gas emitted from the filter element. This can provide an organic EL device having a long emission lifetime.

Applicable Example 4

A bottom emission organic EL device according to this applicable example includes a transparent substrate; a transflective layer formed on the transparent substrate; a transparent first electrode formed on the transflective layer; a functional layer containing an organic light-emitting layer and formed on the transparent first electrode; a transparent second electrode formed on the functional layer; an optical length adjustment layer formed on the transparent second electrode; and a reflective layer formed on the optical length adjustment layer. In the bottom emission organic EL device, an optical resonator is formed between the transflective layer and the reflective layer.

In this structure, the first electrode, the functional layer, and the second electrode constitute an organic EL element, and the optical length adjustment layer and the reflective layer that form an optical resonator is stacked on the organic EL element. Thus, preferable resonance is achieved by adjusting the thickness of the optical length adjustment layer in accordance with the emitting state of the organic EL element. This can provide a bottom emission organic EL device having high luminance.

Applicable Example 5

In the organic EL device according to the applicable example described above, the functional layer corresponding to a plurality of emission colors is preferably formed in a plurality of pixel regions on the substrate, and the thickness of the optical length adjustment layer is preferably adjusted in accordance with the emission colors. In this structure, preferable resonance is achieved for each emission color. This can provide a top emission or bottom emission organic EL device that can produce full-color emission light.

Applicable Example 6

In the organic EL device according to the applicable example described above, the optical length adjustment layer is preferably composed of an optically transparent ultrafine particle or an optically transparent polymer film containing the ultrafine particle. In this structure, light is transmitted through the ultrafine particle and a loss of luminance such as the leakage of light in the optical length adjustment layer can be reduced.

Applicable Example 7

In the organic EL device according to the applicable example described above, a particle size of the ultrafine particle is preferably selected such that light undergoes Rayleigh scattering in the optical length adjustment layer. In this structure, since the light in the optical length adjustment layer undergoes Rayleigh scattering, the scattering of visible light is suppressed and the optical length adjustment layer having higher transparency can be obtained. As a result, the light is not easily attenuated in the optical length adjustment layer and higher luminance light can be produced.

Applicable Example 8

The organic EL device according to the applicable example described above preferably further includes a protection film having gas impermeability, the protection film being disposed between the second electrode and the optical length adjustment layer. In this structure, the protection film suppresses the deactivation of the organic EL element due to a gas emitted from the filter element. This can provide a top emission or bottom emission organic EL device including an organic EL device having a long emission lifetime.

Applicable Example 9

The organic EL device according to the applicable example described above preferably further includes a partition wall that defines a plurality of pixel regions; and a supporting electrode disposed on the partition wall. In the organic EL device, the second electrode is preferably formed so as to cover the partition wall and the plurality of pixel regions; and the supporting electrode preferably has lower sheet resistance than the second electrode.

In this structure, the variation in the sheet resistance of the second electrode can be reduced by disposing the supporting electrode on the partition wall that does not block emission light. As a result, a current flowing between the first and second electrodes through the functional layer during light emission is less likely to vary among the plurality of pixel regions. This can provide a top emission or bottom emission organic EL device having more uniform luminance among a plurality of pixel regions.

Applicable Example 10

An electronic apparatus according to this applicable example includes the organic EL device of the applicable example described above. In this structure, an electronic apparatus with excellent viewability including a top emission or bottom emission organic EL device having high luminance can be provided.

Applicable Example 11

A method for manufacturing a top emission organic EL device according to this applicable example includes a reflective layer formation step of forming a reflective layer in at least one pixel region on a substrate; a first electrode formation step of forming a transparent first electrode on the reflective layer; a functional layer formation step of forming a functional layer containing an organic light-emitting layer on the first electrode; a second electrode formation step of forming a transparent second electrode on the functional layer; an optical length adjustment layer formation step of forming an optical length adjustment layer on the second electrode; and a transflective layer formation step of forming a transflective layer on the optical length adjustment layer. In the optical length adjustment layer formation step, the thickness of the optical length adjustment layer is adjusted such that light that is emitted from the organic light-emitting layer and passes through the transflective layer resonates with light that is emitted from the organic light-emitting layer, is reflected by the transflective layer and then the reflective layer, and passes through the transflective layer.

In this method, an organic EL element is formed through the first electrode formation step, the functional layer formation step, and the second electrode formation step. In the optical length adjustment layer formation step, the optical length adjustment layer that constitutes an optical resonator between the transflective layer and the reflective layer is formed on the organic EL element. Thus, preferable resonance is achieved by adjusting the thickness of the optical length adjustment layer in accordance with the emitting state of the organic EL element. This can provide manufacturing of a top emission organic EL device having high luminance.

Applicable Example 12

The method for manufacturing the organic EL device according to the applicable example described above preferably further includes a partition wall formation step of forming a partition wall that defines the at least one pixel region including a plurality of pixel regions on the substrate; an ejection step of ejecting an at least one-color liquid body containing a filter element formation material to the pixel regions; and a film formation step of forming an at least one-color filter element on the transflective layer by solidifying the ejected liquid body.

In this method, the at least one-color filter element can be formed on the optical resonator through the ejection step and the film formation step. Thus, the light emitted from the organic EL element passes through the filter element without being leaked and the chromaticity of emission colors is corrected with the filter element. This can provide manufacturing of a top emission organic EL device having excellent chromaticity balance and high luminance.

Applicable Example 13

The method for manufacturing the organic EL device according to the applicable example described above preferably further includes a protection film formation step of forming a protection film having gas impermeability between the transflective layer and the filter element. In this method, the protection film having gas impermeability can prevent the entrance of a gas such as water vapor, which is emitted from the filter element, into the organic EL element through the transflective layer. In other words, the protection film prevents the organic EL element from being deactivated due to the gas emitted from the filter element. This can provide manufacturing of an organic EL device having a long emission lifetime.

Applicable Example 14

A method for manufacturing a bottom emission organic EL device according to this applicable example includes a transflective layer formation step of forming a transflective layer in at least one pixel region on a substrate; a first electrode formation step of forming a transparent first electrode on the transflective layer; a functional layer formation step of forming a functional layer containing an organic light-emitting layer on the first electrode; a second electrode formation step of forming a transparent second electrode on the functional layer; an optical length adjustment layer formation step of forming an optical length adjustment layer on the second electrode; and a reflective layer formation step of forming a reflective layer on the optical length adjustment layer. In the optical length adjustment layer formation step, the thickness of the optical length adjustment layer is adjusted such that light that is emitted from the organic light-emitting layer and passes through the transflective layer resonates with light that is emitted from the organic light-emitting layer, is reflected by the transflective layer and then the reflective layer, and passes through the transflective layer.

In this method, an organic EL element is formed through the first electrode formation step, the functional layer formation step, and the second electrode formation step. In the optical length adjustment layer formation step, the optical length adjustment layer that constitutes an optical resonator between the transflective layer and the reflective layer is formed on the organic EL element. Thus, preferable resonance is achieved by adjusting the thickness of the optical length adjustment layer in accordance with the emitting state of the organic EL element. This can provide manufacturing of a bottom emission organic EL device having high luminance.

Applicable Example 15

In the functional layer formation step of the method for manufacturing the organic EL device according to the applicable example described above, the functional layer corresponding to a plurality of emission colors is preferably formed in the at least one pixel region including a plurality of pixel regions on the substrate. In the optical length adjustment layer formation step, the thickness of the optical length adjustment layer is preferably adjusted in accordance with a wavelength of emission light in the functional layer. In this method, since the thickness of the optical length adjustment layer is adjusted in accordance with a wavelength of emission light in the functional layer, preferable resonance is achieved for each emission color. This can provide manufacturing of a top emission or bottom emission organic EL device having high luminance that can produce full-color emission light.

Applicable Example 16

The method for manufacturing the organic EL device according to the applicable example described above preferably further includes a partition wall formation step of forming a partition wall that defines the at least one pixel region including a plurality of pixel regions on the substrate. The functional layer formation step preferably includes an ejection step of ejecting a liquid body containing an organic light-emitting layer formation material to the pixel regions and a film formation step of forming the organic light-emitting layer by solidifying the ejected liquid body. In this method, by ejecting the liquid body containing an organic light-emitting layer formation material in the ejection step, the organic light-emitting layer can be formed efficiently without using an excess amount of the material in each of the pixel regions.

Applicable Example 17

The method for manufacturing the organic EL device according to the applicable example described above preferably further includes a partition wall formation step of forming a partition wall that defines the at least one pixel region including a plurality of pixel regions on the substrate. The optical length adjustment layer formation step preferably includes an ejection step of ejecting a liquid body containing an optically transparent ultrafine particle to the pixel regions and a film formation step of forming the optical length adjustment layer by solidifying the ejected liquid body.

In this method, by ejecting the liquid body containing an optically transparent ultrafine particle in the ejection step, the optical length adjustment layer can be formed efficiently without using an excess amount of the material in each of the pixel regions. Furthermore, the thickness of the optical length adjustment layer can be easily controlled by adjusting the amount of ejecting the liquid body. In other words, an optical length adjustment layer composed of an ultrafine particle in which an emission loss is reduced can be formed so as to have a desired thickness.

Applicable Example 18

The method for manufacturing the organic EL device according to the applicable example described above preferably further includes a protection film formation step of forming a protection film having gas impermeability between the second electrode and the optical length adjustment layer. In this method, even if the optical length adjustment layer is formed in a wet process, the second electrode is protected by the protection film. That is, the protection film suppresses the deactivation of the organic EL element due to a gas such as water vapor emitted from the optical length adjustment layer. This can provide manufacturing of a top emission or bottom emission organic EL device including an organic EL device having a long emission lifetime.

Applicable Example 19

The method for manufacturing the organic EL device according to the applicable example described above preferably further includes a supporting electrode formation step of forming a supporting electrode having lower sheet resistance than the second electrode on a partition wall. In the second electrode formation step, the second electrode is preferably formed so as to cover the partition wall and the at least one pixel region including a plurality of pixel regions.

In this method, the variation in the sheet resistance of the second electrode can be reduced by disposing the supporting electrode on the partition wall that does not block emission light. As a result, a current flowing between the first and second electrodes through the functional layer during light emission is less likely to vary among the plurality of pixel regions. This can provide manufacturing of a top emission or bottom emission organic EL device having more uniform luminance among a plurality of pixel regions.

BRIEF DESCRIPTION OF THE DRAWINGS

The invention will be described with reference to the accompanying drawings, wherein like numbers reference like elements.

FIG. 4 is a flowchart showing a method for manufacturing the organic EL device according to the first embodiment.

DESCRIPTION OF EXEMPLARY EMBODIMENTS

Figure 1:
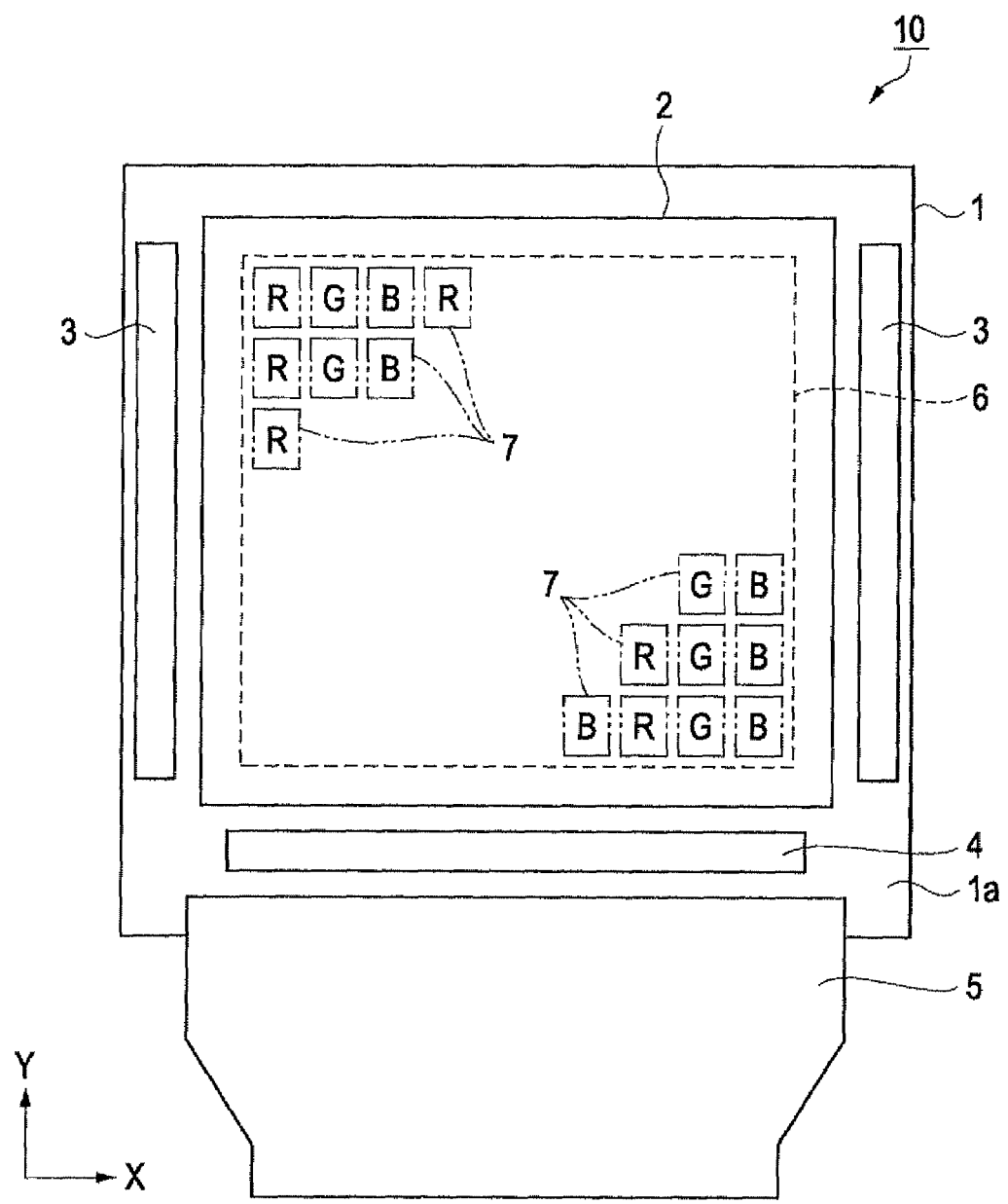
FIG. 1 is a schematic front view of an organic EL device according to a first embodiment.
Figure 2:
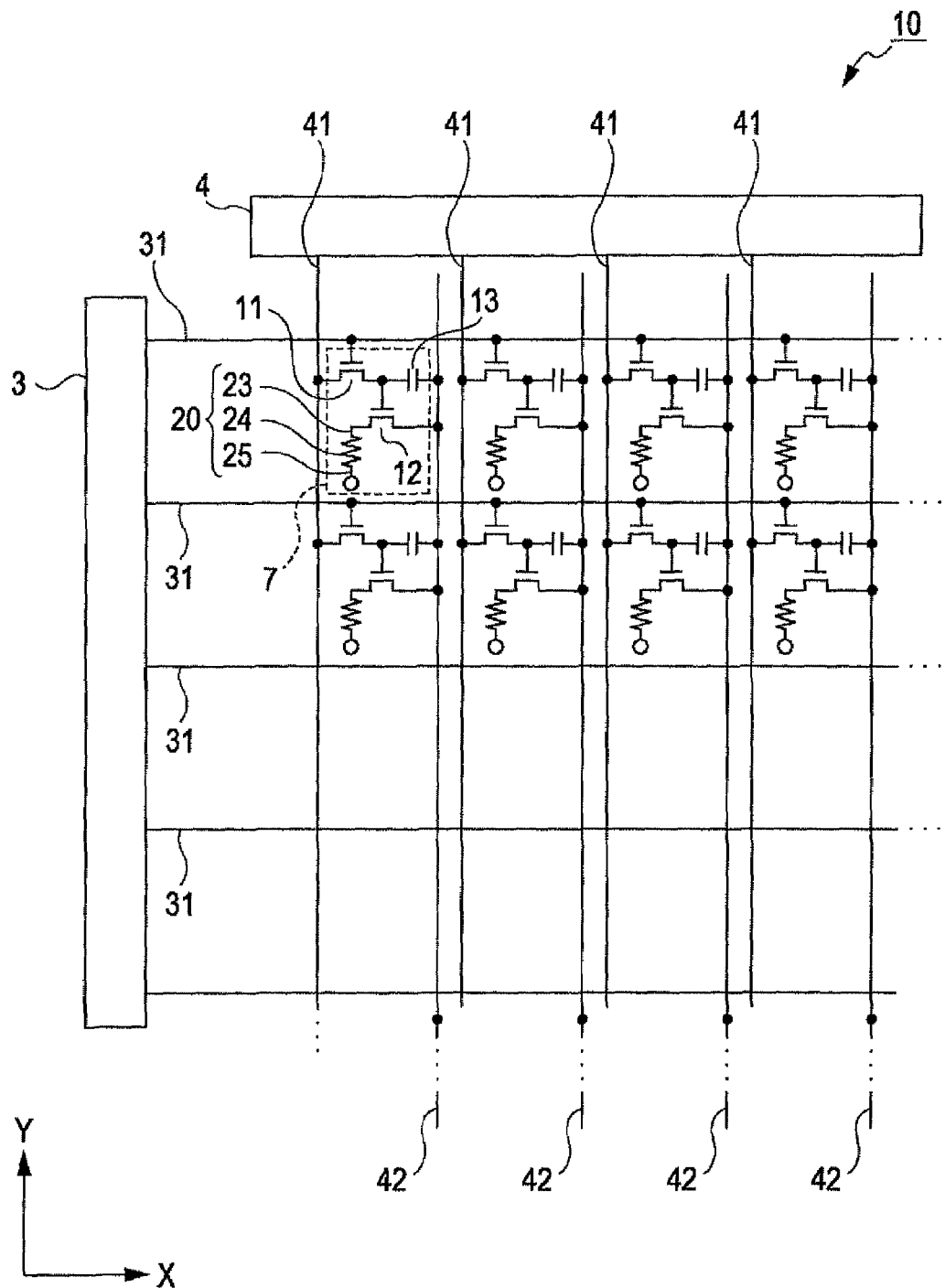
FIG. 2 is an equivalent circuit diagram showing an electrical structure of the organic EL device according to the first embodiment.
Figure 3:
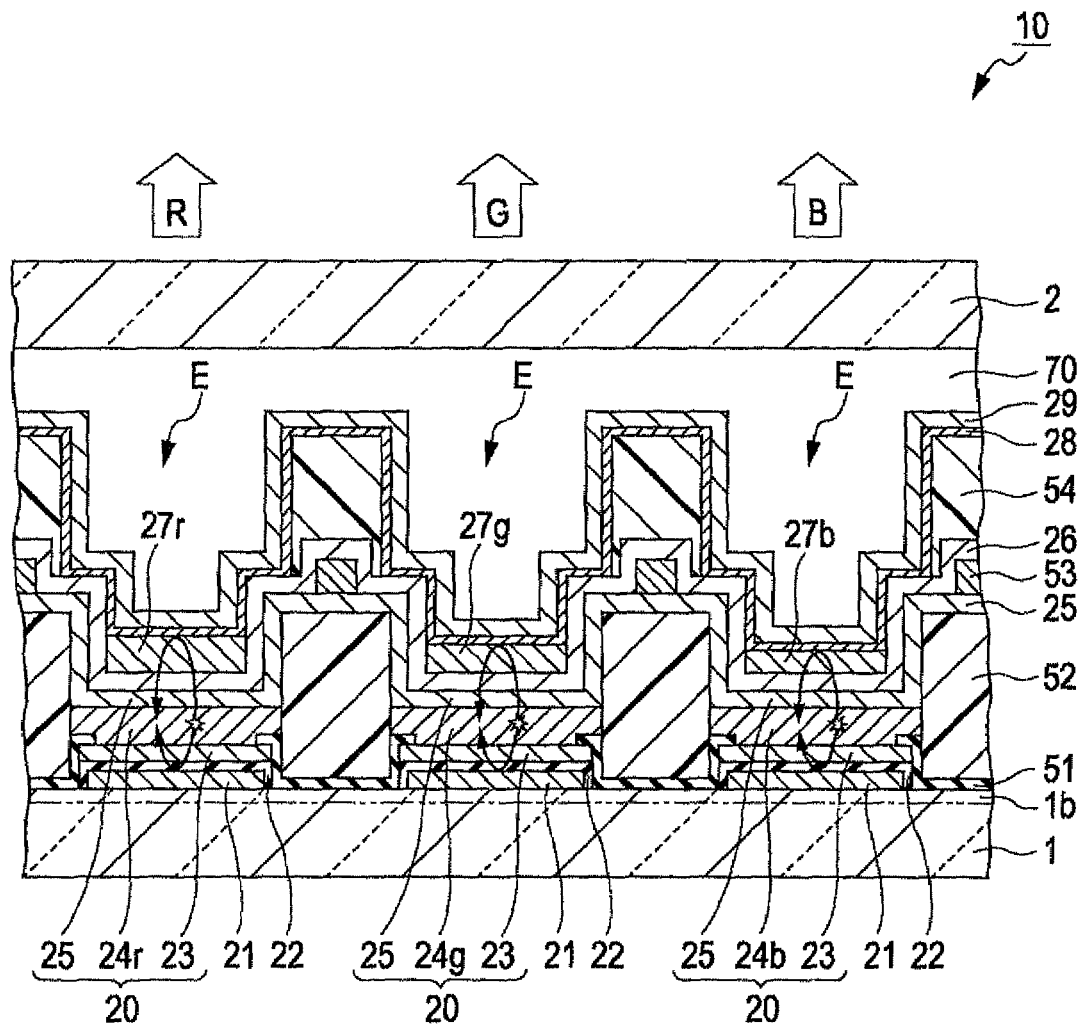
FIG. 3 is a schematic sectional view showing a structure of the organic EL device according to the first embodiment.

Embodiments of the invention will be described with reference to the drawings.
First Embodiment
Top Emission Organic EL Device An embodiment will be described with reference to FIGS. 1 to 3, taking an organic EL device including an organic EL element that is a light-emitting element as an example. FIG. 1 is a schematic front view of the organic EL device; FIG. 2 is an equivalent circuit diagram showing an electrical structure of the organic EL device; and FIG. 3 is a schematic sectional view showing a structure of the organic EL device.

As shown in FIG. 1, an organic EL device 10 according to this embodiment includes an element substrate 1 with a plurality of light-emitting pixels 7 supporting three colors, red (R), green (G), and blue (B), and a sealing substrate 2 disposed so as to face the element substrate 1 at a certain interval. The sealing substrate 2 is bonded to the element substrate 1 using a sealant with high airtightness, to seal a light-emitting area 6 in a frame where the plurality of light-emitting pixels 7 are arranged.

The light-emitting pixels 7 each includes an organic EL element as a light-emitting element. The light-emitting pixels 7 that produce the same color light are arranged in a vertical direction (Y-axis direction) in a stripe form. In reality, the light-emitting pixels 7 are minute, but are enlarged for convenience of illustration.

The element substrate 1 has a size larger than the sealing substrate 2. On a portion where the element substrate 1 is not covered with the sealing substrate 2, two scanning line drive circuit sections 3 that drive the light-emitting pixels 7 and a data line drive circuit section 4 are disposed. The scanning line drive circuit sections 3 and the data line drive circuit section 4 may be mounted on the element substrate 1 as an integrated circuit (IC), or they may be directly formed on the surface of the element substrate 1.

A relay substrate 5 for connecting the drive circuit sections 3 and 4 to an external drive circuit is mounted on a terminal section 1a of the element substrate 1. Examples of the relay substrate 5 include a flexible circuit substrate.

An electrical structure of the organic EL device 10 according to the embodiment will be described. As shown in FIG. 2, the organic EL device 10 is an active matrix organic EL device that uses a thin film transistor (TFT) as a switching element for driving each of the light-emitting pixels 7.

The organic EL device 10 includes a plurality of scanning lines 31 that are connected to the scanning line drive circuit sections 3 and extend in an X-axis direction, a plurality of signal lines 41 that are connected to the data line drive circuit section 4 and extend in a Y-axis direction, and a plurality of power lines 42 that extend along the signal lines 41. The light-emitting pixels 7 are disposed in regions defined by the scanning lines 31 and the signal lines 41 extending in a direction perpendicular to the scanning lines 31 so as to form a matrix.

Each of the light-emitting pixels 7 includes a switching TFT 11 in which a scanning signal is supplied to a gate electrode through each of the scanning lines 31; a holding capacitor 13 that holds a pixel signal supplied from the signal line 41 through the switching TFT 11; a driving TFT 12 in which the pixel signal held by the holding capacitor 13 is supplied to a gate electrode; a pixel electrode 23, which is a first electrode, into which a driving current flows from each of the power lines 42 when the pixel electrode 23 is electrically connected to the power line 42 through the driving TFT 12; and a functional layer 24 sandwiched by the pixel electrode 23 and a negative electrode 25, which is a second electrode.

When the switching TFT 11 is turned on by driving the scanning line 31, the holding capacitor 13 holds the electric potential of the signal line 41 at that moment and the On/Off state of the driving TFT 12 is determined in accordance with the state of the holding capacitor 13. A current flows from the power line 42 to the pixel electrode 23 through the driving TFT 12, and further flows to the negative electrode 25 through the functional layer 24. The functional layer 24 emits light in accordance with the amount of current flowing therethrough. In other words, the pixel electrode 23, the negative electrode 25, and the functional layer 24 constitute an organic EL element 20 as a light-emitting element.

A detailed structure of the organic EL device 10 will be described with reference to FIG. 3. In FIG. 3, the detail illustration of a circuit section 1b including the TFT 11, the TFT 12, and the holding capacitor 13 formed on the element substrate 1 is omitted.

As shown in FIG. 3, the element substrate 1 has a plurality of pixel regions E. In each of the pixel regions E, a reflective layer 21, an insulating film 22, the pixel electrode 23, the functional layer 24, the negative electrode 25, a protection film 26, an optical length adjustment layer 27, a transflective layer 28, and a protection film 29 are formed in sequence. As described above, the pixel electrode 23, the functional layer 24, and the negative electrode 25 constitute the organic EL element 20. Optical length adjustment layers 27r, 27g, and 27b each having a different thickness in accordance with emission color are disposed above the organic EL element 20, such that light that is emitted from the organic EL element 20 and passes through the transflective layer 28 resonates with light that is emitted from the organic EL element 20, is reflected by the transflective layer 28 and then the reflective layer 21, and passes through the transflective layer 28. That is to say, the organic EL device 10 is a top emission organic EL device in which an optical resonator is formed between the reflective layer 21 and the transflective layer 28 and light is emitted from the sealing substrate 2 side.

The element substrate 1 may be a transparent substrate such as a glass substrate or an opaque substrate such as a silicon substrate.

Since the reflective layer 21 disposed on the element substrate 1 constitutes an optical resonator, it is preferably composed of a material having high optical reflectivity. Examples of the material include aluminum (Al) and aluminum compounds such as AlNd. The reflective layer 21 has a thickness of about 50 to 100 nm. The surface (reflection plane) of the reflective layer 21 is preferably substantially flat to prevent scattering of reflected light. Thus, a planarizing layer having insulating properties is disposed to reduce roughness arising in the circuit section 1b formed on a surface of the element substrate 1, and the reflective layer 21 is preferably formed on the planarizing layer.

The insulating film 22 formed so as to cover the reflective layer 21 is preferably composed of a material having high optical transmittance. Examples of the material include silicon oxide, silicon oxynitride, and a mixture thereof. The insulating film 22 has a thickness of about 10 nm.

The pixel electrode 23 formed above the reflective layer 21 through the insulating film 22 is composed of a material such as a transparent conductive film. Examples of the transparent conductive film include indium tin oxide (ITO) and indium zinc oxide (IZO). The pixel electrode 23 has a thickness of about 10 to 20 nm.

In this embodiment, the insulating film 22 is disposed between the reflective layer 21 and the pixel electrode 23. The insulating film 22 protects the reflective layer 21 disposed under the insulating film 22 from being etched when the pixel electrode 23 is patterned. Therefore, the insulating film 22 is not necessarily disposed in accordance with the selection of the material used for the reflective layer 21 and the pixel electrode 23 and with the method for patterning the pixel electrode 23. In other words, by forming a thin film to be the pixel electrode 23 on a thin film to be the reflective layer 21 and then by patterning the layered structure, the reflective layer 21 and the pixel electrode 23, having substantially the same shape when viewed in plan, may be formed on the element substrate 1.

Each of the pixel regions E including the pixel electrode 23 is defined by a first partition wall 51 disposed so as to cover the periphery of the pixel electrode 23, a second partition wall 52 disposed on the first partition wall 51, and a third partition wall 54 disposed above the second partition wall 52.

The first partition wall 51 is made of an inorganic material with insulation properties such as silicon oxide, silicon oxynitride, or a mixture thereof. The first partition wall 51 has a thickness of about 5 to 10 nm. The first partition wall 51 disposed so as to cover the periphery of the pixel electrode 23 prevents a short circuit between the negative electrode 25 and the pixel electrode 23 to be formed, at an edge of the second partition wall 52.

The second partition wall 52 is made of an organic material with insulation properties such as a polyimide resin or an acrylic resin. The second partition wall 52 has a thickness of about 1 to 1.5 µm.

The functional layer 24 formed on the pixel electrode 23 is composed of multiple types of organic layers including an organic light-emitting layer. In this embodiment, the functional layer 24 is selectively formed in each of the pixel regions E in accordance with the emission color of the organic light-emitting layer. A functional layer 24r produces a red (R) emission color, a functional layer 24g produces a green (G) emission color, and a functional layer 24b produces a blue (B) emission color. These are collectively called the functional layer 24.

The functional layer 24 may have a structure in which a hole injection/transport layer, an organic light-emitting layer, and an electron injection/transport layer are stacked. The functional layer 24 has a thickness of about 100 nm.

Examples of the material used to form the hole injection/transport layer include polythiophene derivatives, polyaniline derivatives, and polypyrrole derivatives. In consideration of the carrier balance between the amount of holes injected from the pixel electrode 23 side relative to the organic light-emitting layer and the amount of electrons injected from the negative electrode 25 side, the polythiophene derivatives are preferably used from the standpoint of work function.

Examples of the material used to form the organic light-emitting layer include known light-emitting materials that can emit fluorescence or phosphorescence. A high-molecular-weight organic material is preferred as a light-emitting material that can be applied. Examples of the high-molecular-weight organic material include perylene pigments, coumarin pigments, and rhodamine pigments. A low-molecular-weight organic material such as rubrene, perylene, 9,10-diphenylanthracene, tetraphenylbutadiene, nile red, coumarin 6, or quinacridone may be doped into such a high-molecular-weight organic material.

To emit phosphorescence, a 4,4-dicarbazole-4,4-biphenyl (CBP) derivative may be used as a host material for phosphorescence. A platinum porphyrin complex (PtOEP) derivative that is a red phosphorescence material, an Ir(ppy)3 derivative of an iridium complex that is a green phosphorescence material, and an FIrpic derivative of an iridium complex that is a blue phosphorescence material added to the 4,4-dicarbazole-4,4-biphenyl derivative in accordance with the emission color of the organic light-emitting layer are dissolved in an organic solvent such as cyclohexylbenzene, dihydrobenzofuran, trimethylbenzene, tetramethylbenzene, dichloromethane, dichloroethane, or chloroform or in a mixed solvent of these organic solvents. In particular, a chlorinated organic solvent such as dichloromethane, dichloroethane, or chloroform in which an iridium complex is well-soluble is preferred. The resultant solution can be used to emit phosphorescence.

Examples of the material used to form the electron injection/transport layer include oxadiazole derivatives, oxazole derivatives, phenanthroline derivatives, anthraquinodimethane derivatives, benzoquinone derivatives, naphthoquinone derivatives, anthraquinone derivatives, tetracyanoanthraquinodimethane derivatives, fluorene derivatives, diphenyldicyanoethylene derivatives, diphenoquinone derivatives, and hydroxyquinoline derivatives. Film formation using these materials is preferably conducted by vacuum deposition.

The negative electrode 25 made of a transparent conductive film is disposed so as to cover the functional layer 24 and the second partition wall 52. Examples of the material used to form the negative electrode 25 include ITO, IZO, $SnO_2$, $In_2O_3$, ZnO:Al, and complexes of these oxides. The negative electrode 25 has a thickness of about 10 to 20 nm.

In this embodiment, a supporting electrode 53 is disposed on the negative electrode 25 that covers second partition wall 52, to suppress the variation in the resistance of the negative electrode 25 and stabilize the amount of current flowing through the organic EL element 20. Thus, the supporting electrode 53 is preferably disposed above the second partition wall 52 so as not to block emission light, and disposed in a lattice pattern so as to surround each of the pixel regions E (that is, the light-emitting pixels 7) when viewed in plan. Examples of the material used to form the supporting electrode 53 include metallic materials such as Al having lower sheet resistance than the negative electrode 25.

The protection film 26 is disposed so as to cover the negative electrode 25, to prevent the entrance of a gas such as water vapor, which interferes with emission light, into the organic EL element 20. Thus, the protection film 26 is preferably formed with a material having high gas impermeability and high optical transparency. Examples of the material used to form the protection film 26 include silicon oxide, silicon nitride, or a mixture of these materials. The protection film 26 has a thickness of about 5 to 50 nm.

The optical length adjustment layers 27r, 27g, and 27b each having a different thickness are disposed in the pixel regions E, to provide desired optical length in accordance with their emission colors in an optical resonator. The details are described below.

The third partition wall 54 is disposed above the second partition wall 52 covered with the protection film 26, to hold a liquid body ejected to each of the pixel regions E when the optical length adjustment layers 27r, 27g, and 27b each having a different thickness are selectively formed. Examples of the material used to form the third partition wall 54 include polyimide resins and acrylic resins as with the second partition wall 52. The third partition wall 54 has a thickness of about 1 to 1.5 μm.

The transflective layer 28 is disposed so as to cover the optical length adjustment layers 27r, 27g, and 27b and the third partition wall 54. The transflective layer 28 constituting an optical resonator needs to have both optical transparency and optical reflectivity. The transmittance is set to be 50% or more so that emission light from the organic EL element 20 efficiently passes through the transflective layer 28. Examples of the material used to form the transflective layer 28 include Ca—Ag and Mg—Ag alloys. For example, in the transflective layer 28 composed of a Mg—Ag alloy, a transmittance of 50% or more can be achieved in a case where the thickness is 20 nm or less, in consideration of an extinction coefficient. Accordingly, the transflective layer 28 preferably has a thickness of 10 to 20 nm.

The protection film 29 is disposed so as to cover the transflective layer 28, to prevent the entrance of a gas such as water vapor, which interferes with emission light, into the organic EL element 20 as in the protection film 26 and also to protect the transflective layer 28 from, for example, being flawed due to handling. The protection film 29 can be formed with a material having gas impermeability and optical transparency such as silicon oxide, silicon nitride, or a mixture of these materials. The protection film 29 has a thickness of about 5 to 50 nm.

The element substrate 1 including a plurality of organic EL elements 20 supporting three colors, red (R), green (G), and blue (B) is bonded to the sealing substrate 2 through a space 70.

The sealing substrate 2 may be a transparent substrate such as a glass substrate. As described above, the sealing substrate 2 is bonded to the element substrate 1 using a sealant in a region that surrounds the light-emitting area 6 (refer to FIG. 1), and sealed to prevent the entrance of a gas such as water vapor into the space 70. This provides a longer emission lifetime due to the combined effect of the protection films 26 and 29 that protect the organic EL element 20, and achieves the organic EL device 10 with high reliability.

Although the space 70 is formed by facing the element substrate 1 and sealing substrate 2 at a certain interval in this embodiment, the space 70 may be filled with a transparent sealant. A spacer may be disposed between the element substrate 1 and sealing substrate 2 to maintain the interval provided by the space 70. The spacer is preferably disposed on the third partition wall 54. By disposing the spacer, the sealing substrate 2 becomes not easily deformable even when being pressed from the outside, which protects the organic EL element 20 from being damaged by the sealing substrate 2.

Next, an optical resonance structure will be described. In producing emission light having a desired peak wavelength λ in accordance with its emission color, the relationship between optical distance L from the reflective layer 21 to the transflective layer 28 and phase shift Φ (radian) occurring when the light reflects at the reflective layer 21 and the transflective layer 28 is derived from the following Formula (1) (refer to International Publication No. WO01/039554):

$$(2L)/\lambda + \Phi/2\pi = m \text{ (}m\text{: integer)} \tag{1}$$

In this embodiment, the wave ranges of red (R) light, green (G) light, and blue (B) light are assumed to be 600 to 750 nm, 500 to 600 nm, and 400 to 500 nm, respectively. The optical distance L of each of the emission colors is set so as to obtain a peak wavelength λ within each of the wave ranges.

The optical distance L is the sum of the optical distances of each layer disposed between the reflective layer 21 and the transflective layer 28. In this embodiment, because each of the insulating film 22, the pixel electrode 23, the functional layer 24, the negative electrode 25, and the protection film 26 has a substantially constant thickness, the optical distance L according to each of the emission colors is determined by the optical distances of the optical length adjustment layers 27r, 27g, and 27b.

The optical distances L of the optical length adjustment layers 27r, 27g, and 27b are determined by thickness and a refractive index. The optical length adjustment layers 27r, 27g, and 27b in this embodiment are composed of ultrafine particles having optical transparency. By selecting ultrafine particles having a proper refractive index and a particle size and by differentiating the thickness thereof, suitable optical distances L are achieved in accordance with emission colors to optimize optical resonance.

Specifically, antimony-doped tin oxide (ATO) having a particle size of 10 to 30 nm (number average particle size 22 nm) is used as the ultrafine particles. The refractive index n of antimony-doped tin oxide is about 1.65. The thickness of the optical length adjustment layer 27r corresponding to a red emission color is set to be 150 nm, the thickness of the optical length adjustment layer 27g corresponding to a green emission color is set to be 90 nm, and the thickness of the optical length adjustment layer 27b corresponding to a blue emission color is set to be 60 nm.

An ink jet method is used to form the optical length adjustment layers 27r, 27g, and 27b using ultrafine particles. The details are described in a method for manufacturing the organic EL device 10.

In a case where an ultrafine particle is used, light scattering due to a size effect of a particle size needs to be considered. When the ultrafine particle is assumed to have a globular shape, the following Formula (2) is established:

$$\alpha = \pi D / \lambda \qquad (2)$$

where $\alpha$ is size parameter related to wavelength $\lambda$ of a scattering coefficient and the size of a scattering particle having a particle diameter of D.

Rayleigh scattering occurs in a range of $\alpha < 0.4$, Mie scattering occurs in a range of $0.4 < \alpha < 3$, and diffraction scattering occurs in a range of $3 < \alpha$. Since visible light is scattered in the range of Mie scattering, the ultrafine particle causing Rayleigh scattering is preferred. The scattering of visible light is suppressed by using the ultrafine particle causing Rayleigh scattering, thereby increasing the transparency of the optical length adjustment layers 27r, 27g, and 27b.

Specifically, if $\alpha$ is 0.4 in Formula (2), $D = 0.4\lambda/\pi \approx 0.127\lambda$ is derived. In consideration of blue emission light having the shortest wavelength, $\lambda = 400$ nm gives a particle diameter D of about 50 nm. Thus, the ultrafine particle preferably has a particle size of 50 nm or less.

If the particle size of the ultrafine particle can be changed in accordance with emission colors, in consideration of the shortest wavelength of red light, that is, $\lambda = 600$ nm, the ultrafine particle of the optical length adjustment layer 27r preferably has a particle size of 76 nm or less. Similarly, in consideration of the shortest wavelength of green light, that is, $\lambda = 500$ nm, the ultrafine particle of the optical length adjustment layer 27g preferably has a particle size of 63 nm or less.

Method for Manufacturing Organic EL Device

Next, a method for manufacturing an organic EL device 10 will be described with reference to FIGS. 4 to 8. FIG. 4 is a flowchart showing a method for manufacturing an organic EL device. FIGS. 5A to 5E, FIGS. 6F to 6I, FIGS. 7J to 7L, and FIGS. 8M to 8O are schematic sectional views showing the method for manufacturing the organic EL device.

As shown in FIG. 4, the method for manufacturing the organic EL device 10 according to this embodiment includes a reflective layer formation step (step S1) of forming a reflective layer 21 on an element substrate 1, an insulating film formation step (step S2) of forming an insulating film 22 that covers the reflective layer 21, and a pixel electrode formation step (step S3) of forming a pixel electrode 23. The method also includes a first partition wall formation step (step S4) of forming a first partition wall 51, a second partition wall formation step (step S5) of forming a second partition wall 52 on the first partition wall 51, and a functional layer formation step (step S6) of forming a functional layer 24 on the pixel electrode 23. The method also includes a negative electrode formation step (step S7) of forming a negative electrode 25 that covers the functional layer 24 and the second partition wall 52, a supporting electrode formation step (step S8) of forming a supporting electrode 53 of the negative electrode 25, and a first protection film formation step (step S9) of forming a protection film 26 that covers the negative electrode 25. Furthermore, the method includes a third partition wall formation step (step S10) of forming a third partition wall 54, an optical length adjustment layer formation step (step S11) of forming optical length adjustment layers 27r, 27g, and 27b in pixel regions E defined by the third partition wall 54, a transflective layer formation step (step S12) of forming a transflective layer 28 that covers the optical length adjustment layers 27r, 27g, and 27b, a second protection film formation step (step S13) of forming a protection film 29 that covers the transflective layer 28, and a sealing step (step S14) of bonding and sealing the element substrate 1 on which an organic EL element 20 is formed and a sealing substrate 2.

Although the description of a step of forming, on the element substrate 1, a circuit section 1b used to drive the organic EL element 20 is omitted, a well-known method for forming wiring or the like that connects such elements to a thin film transistor and a holding capacitor can be used.

Figure 5A:
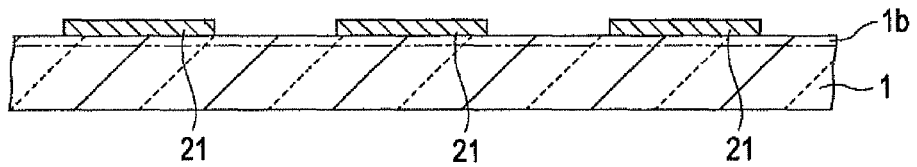
FIGS. 5A to 5E are schematic sectional views showing the method for manufacturing the organic EL device according to the first embodiment.

The step S1 of FIG. 4 is the reflective layer formation step. In the step S1, as shown in FIG. 5A, the reflective layer 21 corresponding to each of the light-emitting pixels 7 (refer to FIG. 1) is formed on the circuit section 1b of the element substrate 1. After an aluminum (Al) thin film having a thickness of about 50 to 100 nm is formed by sputtering aluminum, the reflective layer 21 is formed by patterning the aluminum thin film in a desired shape through photolithography. The material is not limited to aluminum as described above, and AlNd may be used. The method for forming the reflective layer 21 is also not limited to sputtering, and mask deposition can be used to selectively form the reflective layer 21. This step will continue to step S2.

Figure 5B:
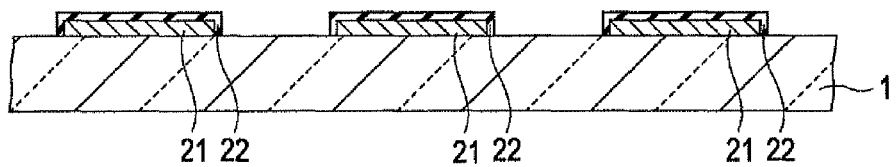

The step S2 of FIG. 4 is the insulating film formation step. In the step S2, as shown in FIG. 5B, the insulating film 22 that covers the reflective layer 21 is formed. After a silicon oxide thin film having a thickness of about 5 to 50 nm is formed by sputtering silicon oxide so as to cover the reflective layer 21, the insulating film 22 is formed by patterning the silicon oxide thin film in a desired shape through photolithography. The material is not limited to silicon oxide as described above, and silicon nitride or a compound of silicon oxide and silicon nitride may be used. This step will continue to step S3.

Figure 5C:
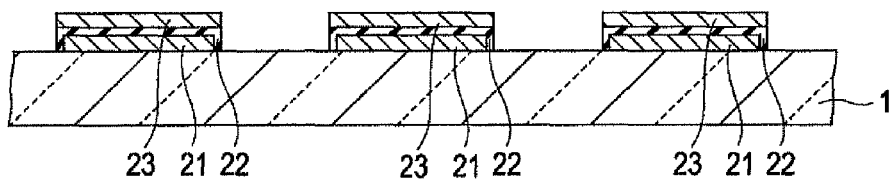

The step S3 of FIG. 4 is the pixel electrode formation step. In the step S3, as shown in FIG. 5C, the pixel electrode 23 is formed above the reflective layer 21. After a transparent conductive film having a thickness of about 10 to 20 nm is formed by sputtering ITO, the pixel electrode 23 is formed by patterning the transparent conductive film in a desired shape through photolithography. The material is not limited to ITO as described above, and IZO may be used. Since the reflective layer 21 is covered with the insulating film 22, the reflective layer 21 is not etched during patterning of the transparent conductive film. In addition, the adhesiveness of the pixel electrode 23 can be achieved by placing the insulating film 22 between the reflective layer 21 and the pixel electrode 23. The method for forming the transparent conductive film is not limited to sputtering, and vacuum deposition, chemical-vapor deposition (CVD), or the like can be used. This step will continue to step S4.

Figure 5D:
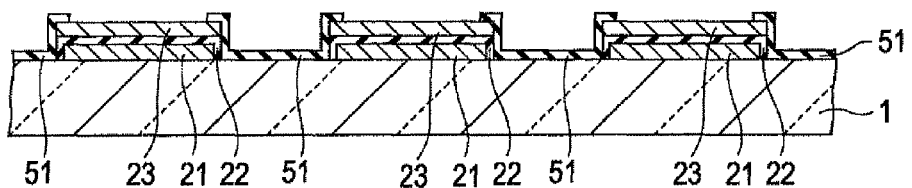

The step S4 of FIG. 4 is the first partition wall formation step. In the step S4, as shown in FIG. 5D, the first partition wall 51 that covers the periphery of the pixel electrode 23 is formed while filling the space between the pixel electrode 23 and the next pixel electrode 23. The first partition wall 51 having a thickness of about 5 to 50 nm is formed by sputtering silicon oxide while a necessary portion of the pixel electrode 23 is masked with a photoresist. This step will continue to step S5.

Figure 5E:
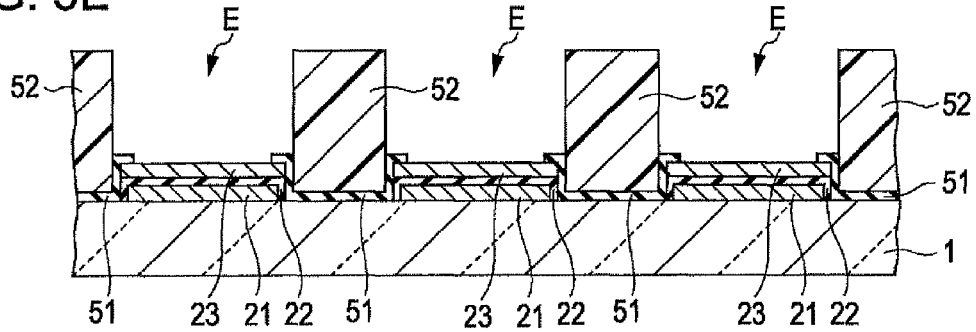

The step S5 of FIG. 4 is the second partition wall formation step. In the step S5, as shown in FIG. 5E, the second partition wall 52 is formed on the first partition wall 51. After a photosensitive resin layer having a thickness of about 1 to 1.5 μm is formed by applying a photosensitive polyimide resin or acrylic resin to the surface of the first partition wall 51 formed on the element substrate 1, the second partition wall 52 that surrounds the pixel electrode 23 is formed by exposing and developing the photosensitive resin layer. Each of the pixel regions E is defined by the second partition wall 52. The thickness (height) of the second partition wall 52 is determined by the total amount of a liquid body applied to the pixel regions E and the planar area of the pixel regions E in the subsequent steps. This step will continue to step S6.

The step S6 of FIG. 4 is the functional layer formation step. As described above, the functional layer 24 according to this embodiment has a structure in which the hole injection/transport layer, the organic light-emitting layer, and the electron injection/transport layer are stacked. In this embodiment, the hole injection/transport layer and the organic light-emitting layer are formed by an ink jet method.

The pixel regions E are surface-treated in advance to support the ejection of the liquid body conducted in the later step. A plasma treatment is conducted using oxygen gas, which imparts liquid affinity to the surface of the pixel electrode 23 made of an inorganic material and the surface of the first partition wall 51 also made of an inorganic material that protrudes into each of the pixel regions E. Subsequently, another plasma treatment is conducted using a fluorine gas such as $CF_4$, which imparts liquid repellency to the surface (top and side surfaces) of the second partition wall 52 made of an organic material.

Figure 6F:
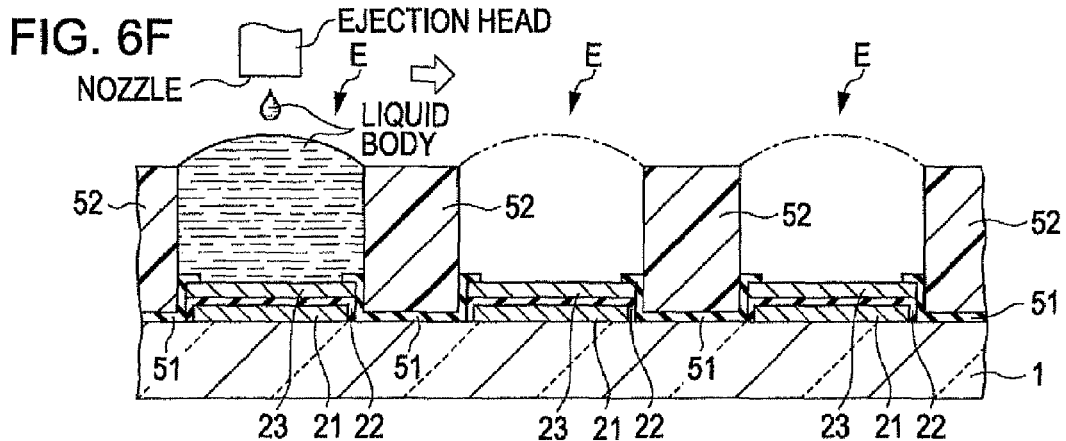
FIGS. 6F to 6I are schematic sectional views showing the method for manufacturing the organic EL device according to the first embodiment.

As shown in FIG. 6F, the liquid body containing a material for forming the hole injection/transport layer is applied to the pixel regions E. The hole injection/transport layer is formed by drying the applied liquid body to remove the solvent thereof. The liquid body is applied by an ink jet method in which the liquid body is ejected as a droplet from a nozzle of an ejection head. The ejection head, which is equipped in a recording apparatus such as an ink jet printer, includes a piezoelectric element as a driving unit for ejecting a droplet from the nozzle. The liquid body is ejected as a droplet to each of the pixel regions E by scanning the element substrate 1 with the ejection head filled with the liquid body.

Since the surface treatment is conducted in advance, the droplet that lands within each of the pixel regions E spreads across each of the pixel regions E. The droplet that lands on the second partition wall 52 is also contained in each of the pixel regions E because the surface of the second partition wall 52 has liquid repellency. Thus, the required amount of the liquid body can be applied as a droplet with high precision (in terms of the amount and the position of the ejection) and efficiency.

In this embodiment, poly(3,4-ethylenedioxythiophene)/polystyrene sulfonate (PEDOT/PSS) is used as a material for forming the hole injection/transport layer. PEDOT/PSS is dissolved in an organic solvent (primary solvent) such as glycol, alcohol, or ether. A secondary solvent such as N-methylpyrrolidone (NMP), dimethyl sulfoxide (DMSO), N,N-dimethylformamide (DMF), or N,N-dimethylacetamide (DMAC) is added to the resultant solution to obtain the liquid body (solution), which is ejected to the pixel regions E.

Similarly, the liquid body containing an organic light-emitting layer formation material is ejected to the pixel regions E. The organic light-emitting layer is formed on the hole injection/transport layer by drying the ejected liquid body to remove the solvent thereof. Obviously, three types of liquid bodies (solutions) are used in which the organic light-emitting layer formation materials to produce three emission colors, red, green, and blue are selected from the materials described above. Each of the liquid bodies is injected into different ejection heads and ejected as a droplet to a desired one of the pixel regions E in accordance with its emission color.

Although these liquid bodies can be dried by a method such as lamp annealing that utilizes irradiation of, for example, infrared rays or heating of a substrate with a heater, drying under reduced pressure is preferred because a solvent can be uniformly dried.

The electron injection/transport layer is then formed by vacuum deposition on the organic light-emitting layer with the material described above.

Figure 6G:
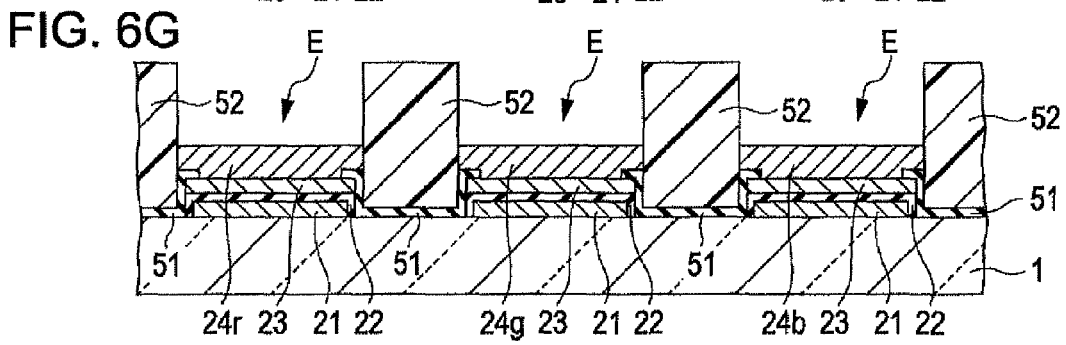

Through the steps described above, the functional layers 24r, 24g, and 24b are formed in the pixel regions E as shown in FIG. 6G. In this embodiment, the liquid bodies are applied such that the functional layers 24r, 24g, and 24b have substantially the same thickness. This step will continue to step S7.

Figure 6H:
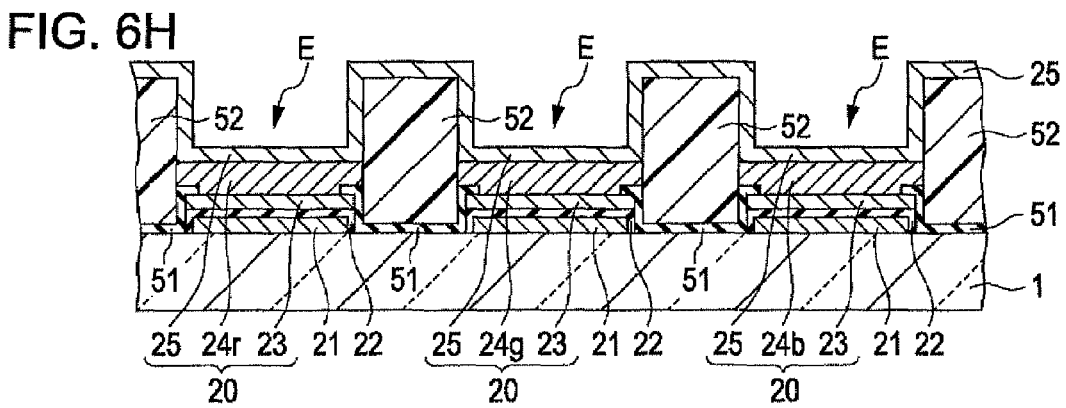

The step S7 of FIG. 4 is the negative electrode formation step. In the step S7, as shown in FIG. 6H, the negative electrode 25 that covers the functional layers 24r, 24g, and 24b and the second partition wall 52 is formed. The negative electrode 25 composed of a transparent conductive film having a thickness of about 10 to 20 nm is formed by vacuum-depositing ITO. The material is not limited to ITO as described above. Because vacuum deposition causes damage such as thermal shock less than sputtering, the organic EL element 20 can be manufactured in a high yield. This step will continue to step S8.

Figure 6I:
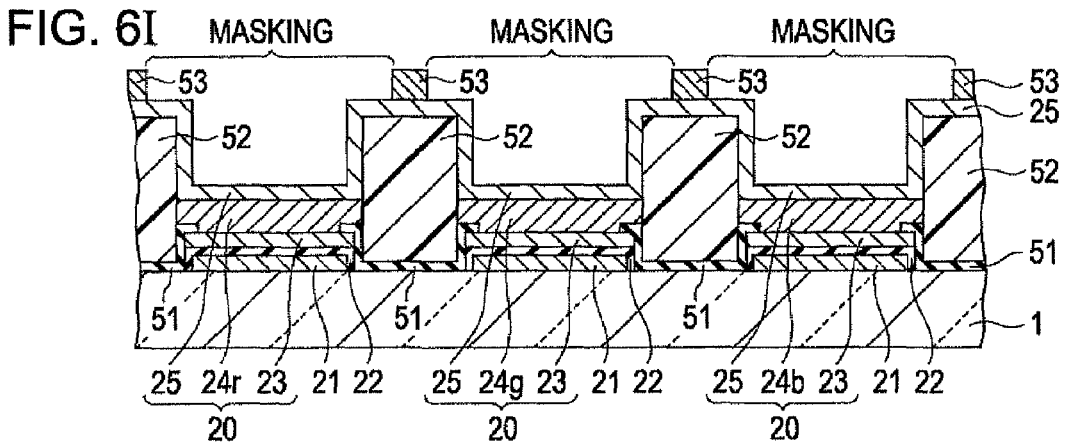

The step S8 of FIG. 4 is the supporting electrode formation step. In the step S8, as shown in FIG. 6I, the supporting electrode 53 is formed on the negative electrode 25 that covers the second partition wall 52, by mask deposition of aluminum that is a formation material. The thickness and width of the supporting electrode 53 are determined by the sheet resistance of the negative electrode 25 and the amount of current flowing through the organic EL element 20. This step will continue to step S9.

Figure 7J:
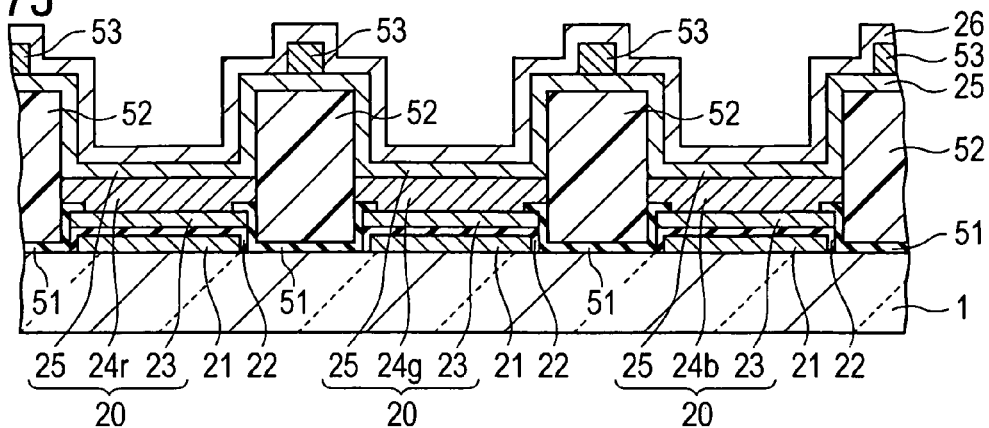
FIGS. 7J to 7L are schematic sectional views showing the method for manufacturing the organic EL device according to the first embodiment.

The step S9 of FIG. 4 is the first protection film formation step. In the step S9, as shown in FIG. 7J, the protection film 26 that covers the negative electrode 25 and the supporting electrode 53 is formed. The protection film 26 is formed by vacuum-depositing silicon oxide so as to have a thickness of about 5 to 50 nm. The material is not limited to silicon oxide as described above. This step will continue to step S10.

Figure 7K:
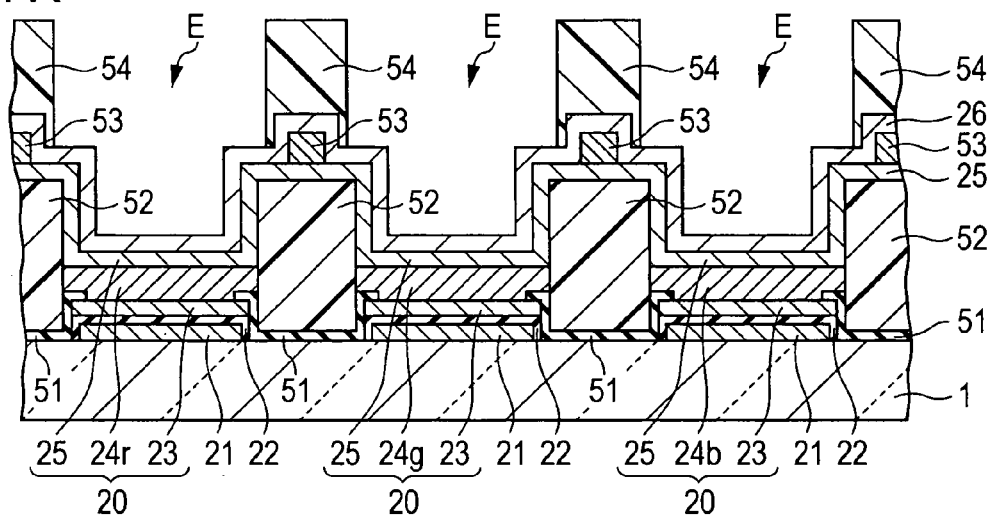

The step S10 of FIG. 4 is the third partition wall formation step. In the step S10, as shown in FIG. 7K, the third partition wall 54 is formed above the second partition wall 52. The third partition wall 54 having a thickness of about 1 to 2 μm and made of an organic material such as a polyimide resin or an acrylic resin is formed by the same method as the second partition wall 52. This step will continue to step S11.

The step S11 of FIG. 4 is the optical length adjustment layer formation step. In this embodiment, the optical length adjustment layers 27r, 27g, and 27b (refer to FIG. 3) are formed by the same method as the functional layers 24r, 24g, and 24b, that is, an ink jet method. The component of the liquid body (solution) is as follows:

Ultrafine particles: antimony-doped tin oxide with a particle size of 10 to 30 nm (number average particle size 22 nm);

Solvent: a mixed solution of toluene and trimethylbenzene with a mixing ratio of 20:80; and ATO solid content: 30 wt %.

Before the liquid body is applied, a surface treatment (plasma treatment) that imparts liquid affinity and liquid repellency to the pixel regions E defined by the third partition wall 54 is preferably conducted.

Figure 7L:
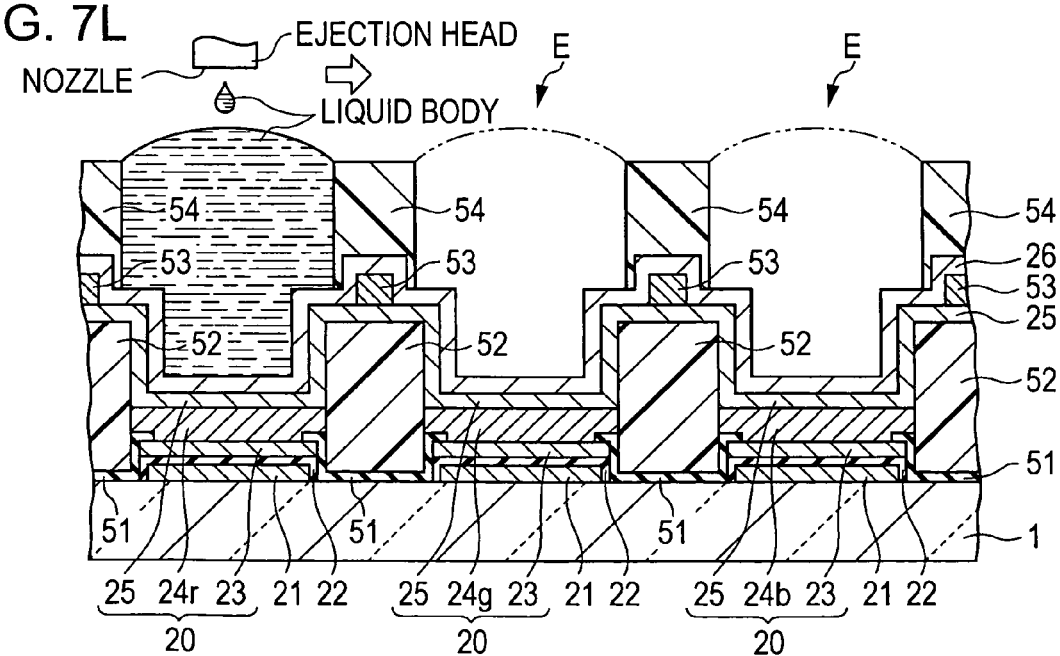
Figure 8M:
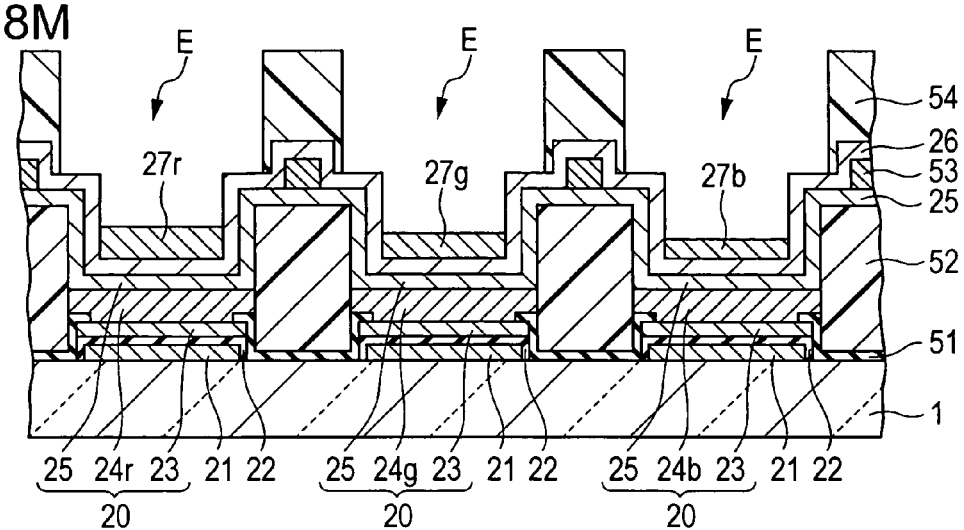
FIGS. 8M to 8O are schematic sectional views showing the method for manufacturing the organic EL device according to the first embodiment.

As shown in FIG. 7L, the liquid body containing ultrafine particles is injected into an ejection head and ejected as a droplet to the pixel regions E. The amounts of ejecting the liquid body are differentiated in accordance with emission colors. As shown in FIG. 8M, the optical length adjustment layers 27r, 27g, and 27b each having a different thickness in accordance with emission color are formed by drying the ejected liquid body. Since the ink jet method is adopted, the desired amounts of the liquid body can be applied with high precision in accordance with the emission colors. This can provide the optical length adjustment layers 27r, 27g, and 27b having a desired thickness (the optical length adjustment layer 27r is 150 nm, the optical length adjustment layer 27g is 90 nm, and the optical length adjustment layer 27b is 60 nm).

The component of the liquid body is not limited to this. In addition to ATO, for example, $In_2O_3$, $SnO_2$, ITO, $SiO_2$, $TiO_2$, or ZnO can be used as the ultrafine particles. In the case of ATO, the particle size of the ultrafine particles is about 22 nm. Since the liquid body is ejected from a nozzle of the ejection head, the particle size obviously needs to be adjusted so as to be smaller than the size of the nozzle.

In consideration of dispersiveness of the ultrafine particles with the solvent, the ultrafine particles mixed with a resin binder may be used. Examples of the resin binder include polyacrylic acid, polyacrylamide, and polyvinyl alcohol (PVA). This step will continue to step S12.

Figure 8N:
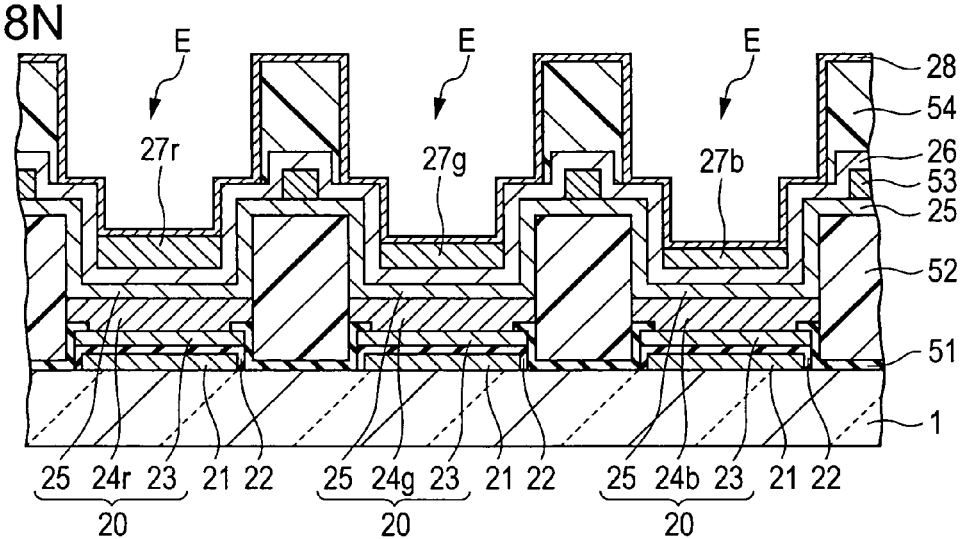

The step S12 of FIG. 4 is the transflective layer formation step. In the step S12, as shown in FIG. 8N, the transflective layer 28 that covers the optical length adjustment layers 27r, 27g, and 27b and the third partition wall 54 is formed. The transflective layer 28 is formed with a Mg—Ag alloy by vacuum deposition or sputtering. As described above, to achieve a transmittance of 50% or more while maintaining optical reflectivity, the thickness is set to be about 10 to 20 nm. The material is not limited to the Mg—Ag alloy, and a Ca—Ag alloy may be used. This step will continue to step S13.

Figure 8O:
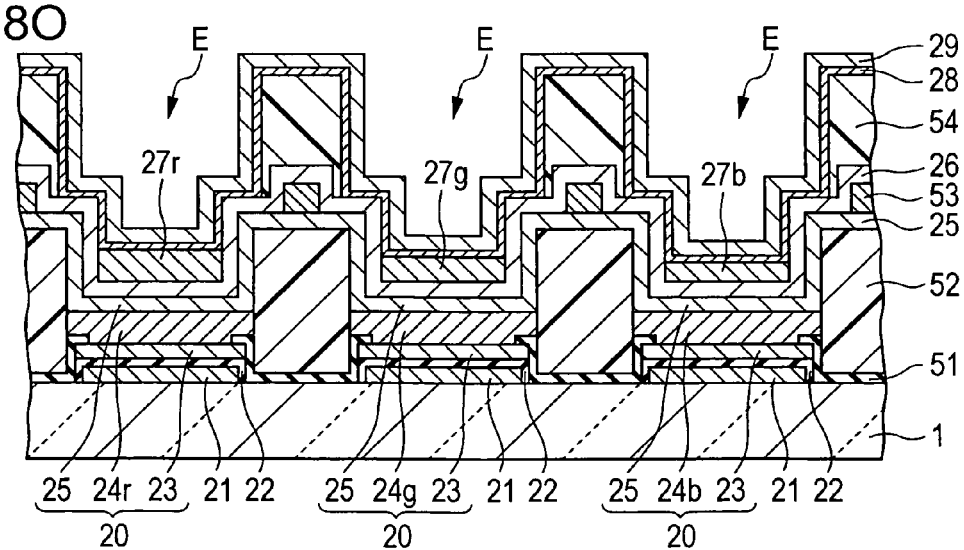

The step S13 of FIG. 4 is the second protection film formation step. In the step S13, as shown in FIG. 8O, the protection film 29 that covers the transflective layer 28 is formed. The method for forming the protection film 29 is the same as that in the step S9, the description is omitted. This step will continue to step S14.

The step S14 of FIG. 4 is the sealing step. In the step S14, as shown in FIG. 3, the element substrate 1 and the sealing substrate 2 are sealed through the space 70.

In the steps of manufacturing the organic EL device 10 described above, since the ink jet method is adopted, the required amount of the liquid body can be ejected to a desired one of the pixel regions E with high precision to form the functional layers 24r, 24g, and 24b and the optical length adjustment layers 27r, 27g, and 27b each having a desired thickness. In other words, the organic EL device 10 in which an optical resonance structure is optimized can be manufactured.

If the optical length adjustment layers 27r, 27g, and 27b and the transflective layer 28 are mounted above the organic EL element 20 in consideration of variation in the emitting state thereof (luminance, spectral characteristics, and chromaticity distribution), the organic EL device 10 in which the optical resonance structure is further optimized can be manufactured.

Figure 9:
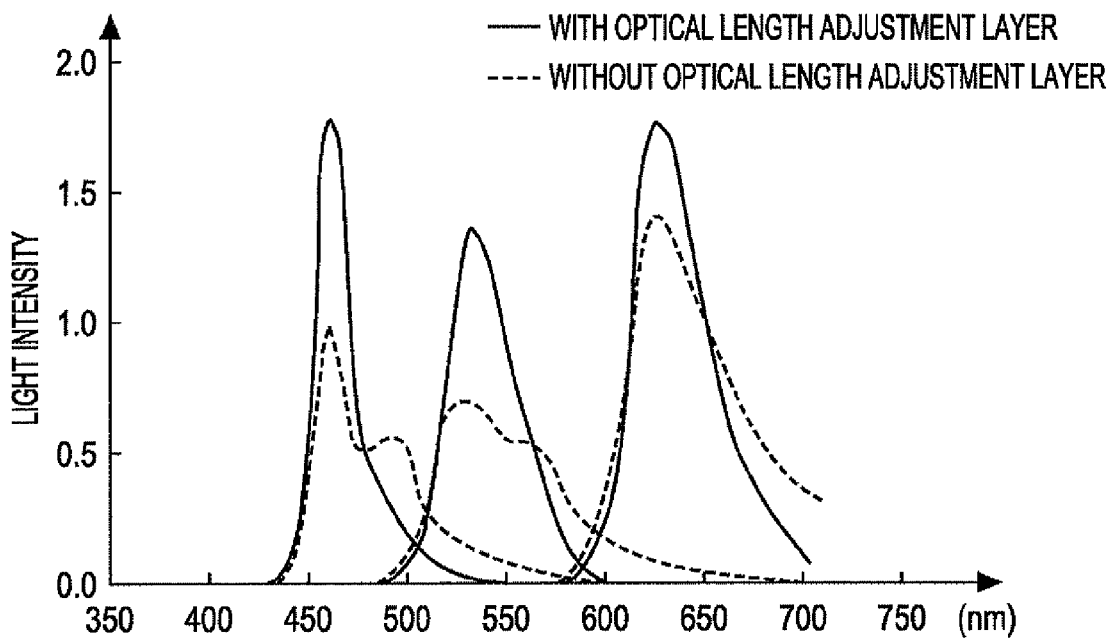
FIG. 9 is a graph showing the spectral characteristics of the organic EL device according to the first embodiment.

FIG. 9 is a graph showing the spectral characteristics of the organic EL device. As shown in FIG. 9, the organic EL device 10 according to this embodiment has peak wavelengths in a red (R) wave range of 600 to 750 nm, in a green (G) wave range of 500 to 600 nm, and in a blue (B) wave range of 400 to 500 nm, compared with the case where the optical length adjustment layers 27r, 27g, and 27b are not disposed. In the organic EL device 10, the light intensity is increased about 1.5 times and the spectral characteristics become sharp.

Figure 10:
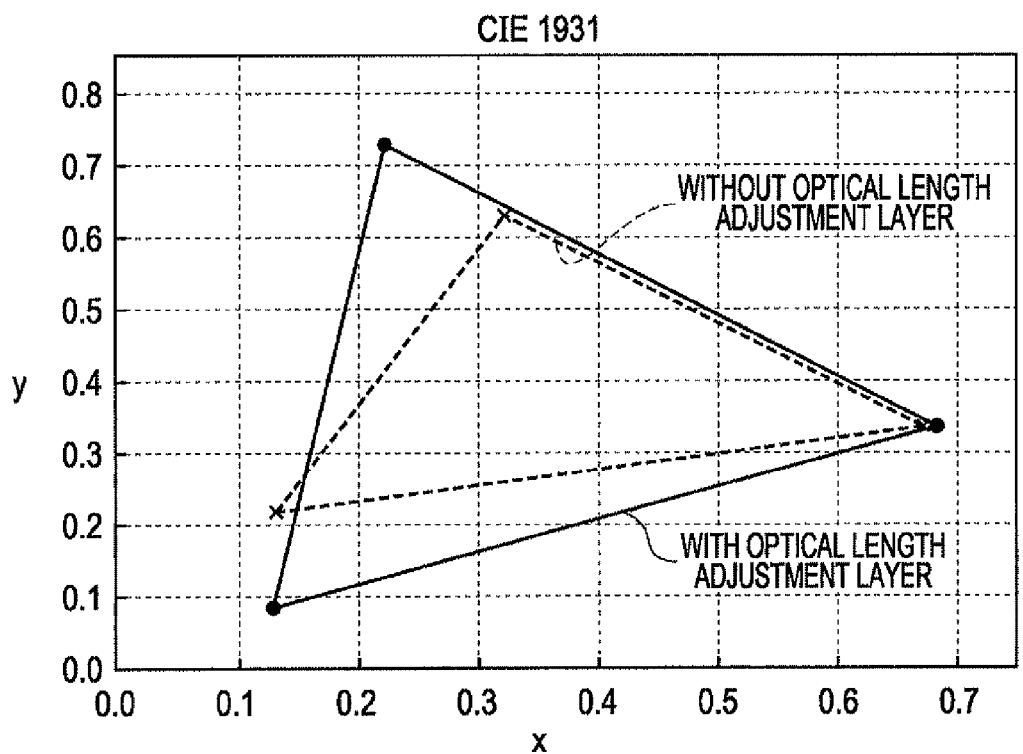
FIG. 10 is a graph showing the chromaticity distribution of emission light from the organic EL device according to the first embodiment.

FIG. 10 is a graph showing the chromaticity distribution of emission light from the organic EL device. As shown in FIG. 10, the organic EL device 10 according to this embodiment has an NTSC ratio of substantially 100%, which represents color reproducibility, whereas an organic EL device in which the optical length adjustment layers 27r, 27g, and 27b are not disposed has an NTSC ratio of 63%. That is to say, the color reproducibility is improved.

Second Embodiment

Another Top Emission Organic EL Device

Another top emission organic EL device will now be described with reference to FIG. 11. The same structures as those of the first embodiment are designated by the same reference numerals.

Figure 11:
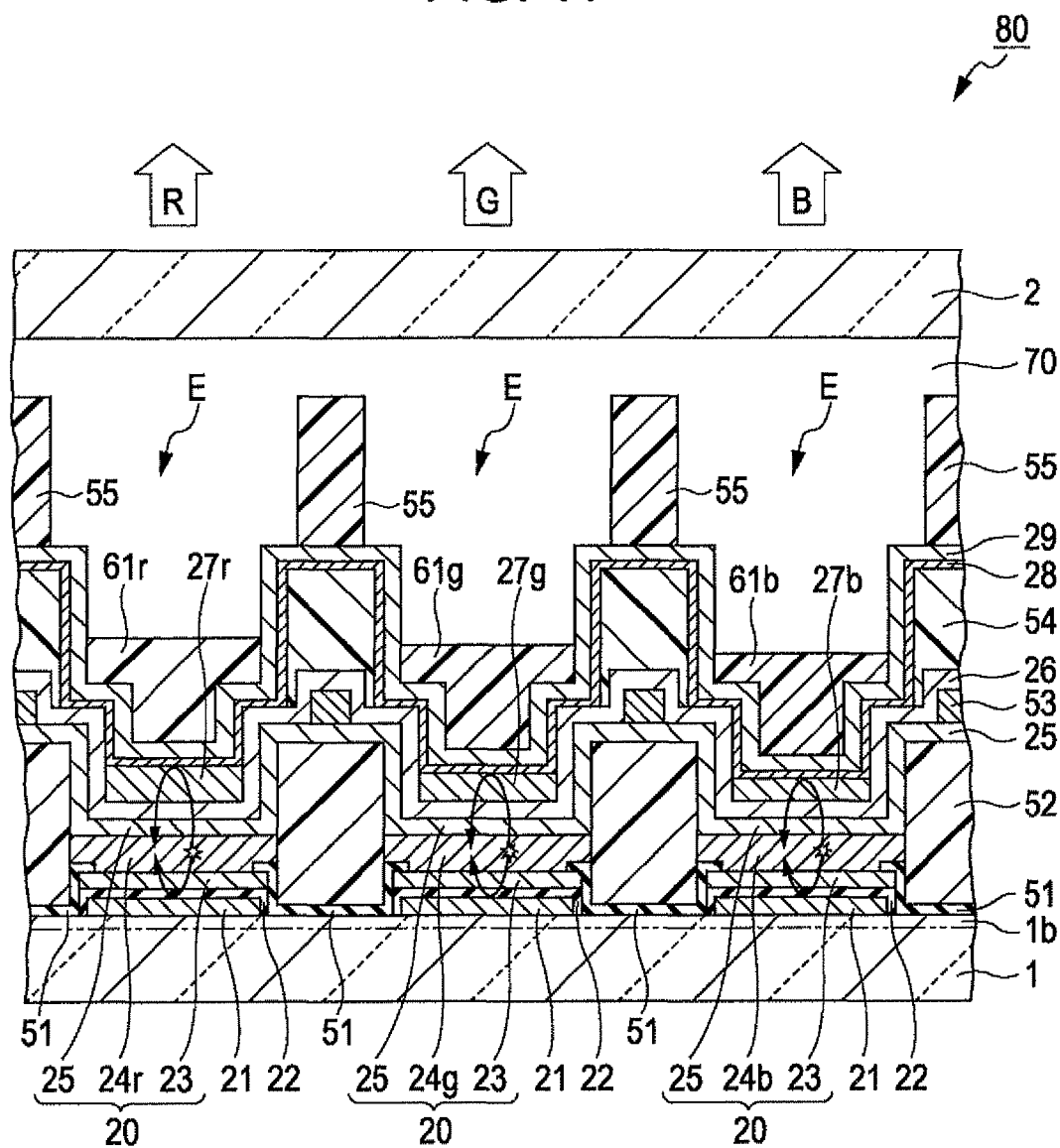
FIG. 11 is a schematic sectional view showing a structure of an organic EL device according to a second embodiment.

FIG. 11 is a schematic sectional view showing a principal structure of another organic EL device. As shown in FIG. 11, an organic EL device 80 according to this embodiment includes, in the pixel regions E, colored layers 61r, 61g, and 61b as filter elements corresponding to emission colors. In addition, a fourth partition wall 55 is disposed above the third partition wall 54, and the colored layers 61r, 61g, and 61b are formed by an ink jet method.

The colored layers 61r, 61g, and 61b are made of a known material such as a colored layer formation material in which a pigment as a coloring material is dispersed in a transparent organic resin material. The colored layer 61r is a red filter element, the colored layer 61g is a green filter element, and the colored layer 61b is a blue filter element. Each of the colored layers 61r, 61g, and 61b is formed on the protection film 29 in each of the pixel regions E.

Since the supporting electrode 53 formed above the second partition wall 52 is made of a conductive metal material such as aluminum and has a thickness that shows low sheet resistance, it shows a light-shielding effect. Thus, the supporting electrode 53 also functions as a light-shielding film (black matrix) between two of the colored layers 61r, 61g, and 61b.

Such an organic EL device 80 has an optical resonator optimized between the reflective layer 21 and the transflective layer 28 while including the colored layers 61r, 61g, and 61b that correspond to the emission colors of the organic EL element 20. Accordingly, the chromaticity of emission light is corrected and the top emission organic EL device 80 having high luminance and excellent color reproducibility can be provided.

Since the colored layers 61r, 61g, and 61b are formed on the protection film 29, a chromaticity shift due to parallax (difference in viewing direction) can be prevented compared with the case where red, green, and blue filter elements are disposed on a surface of the sealing substrate 2, the surface facing the element substrate 1.

The colored layers 61r, 61g, and 61b of the organic EL device 80 are not limited to three colors. For example, if at least one colored layer is disposed in accordance with the chromaticity of emission light from the organic EL element 20, the chromaticity is corrected and the color reproducibility can be improved.

Method for Manufacturing Another Top Emission Organic EL Device

Figure 12:
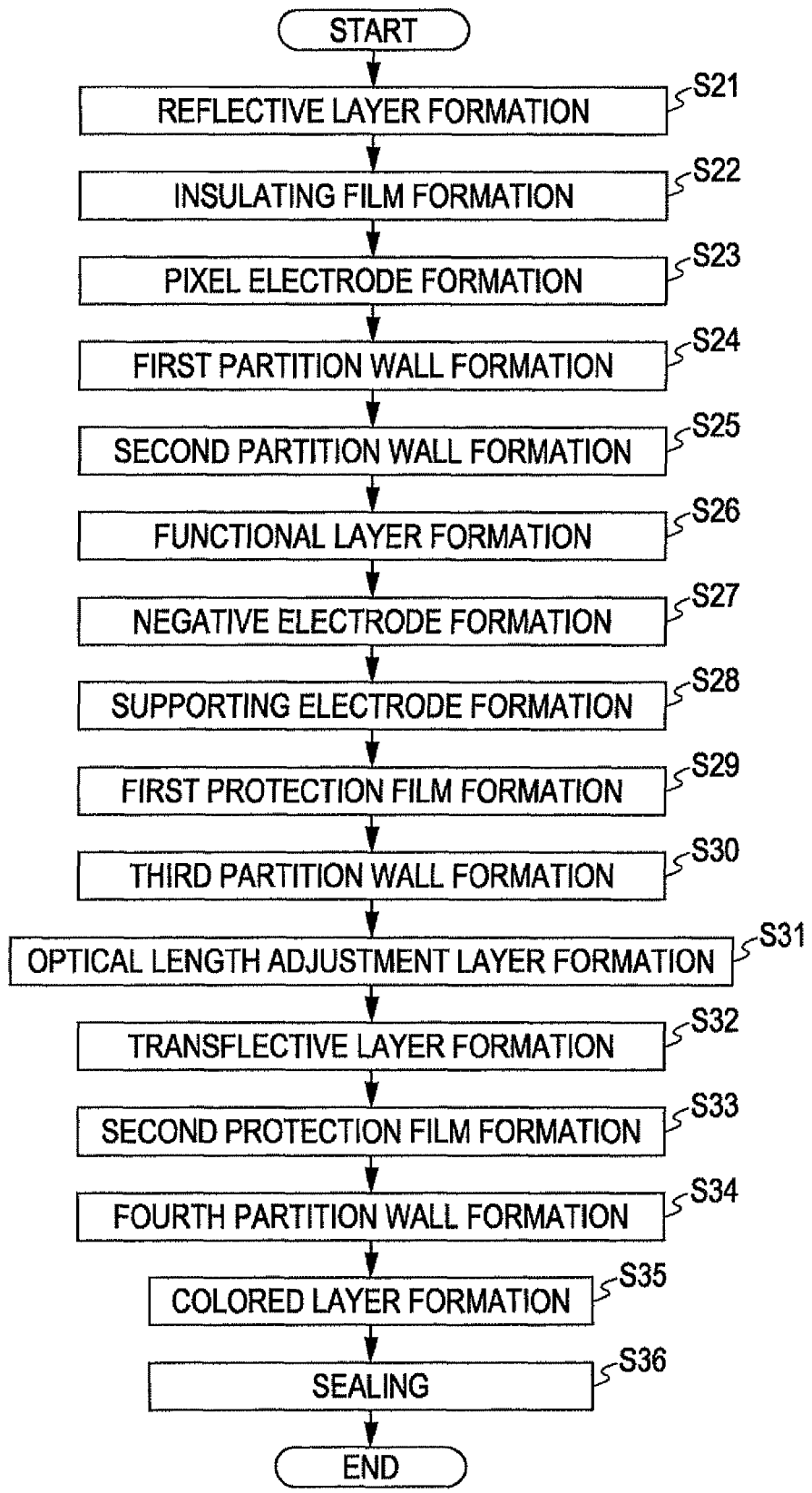
FIG. 12 is a flowchart showing a method for manufacturing the organic EL device according to the second embodiment.
Figure 13A:
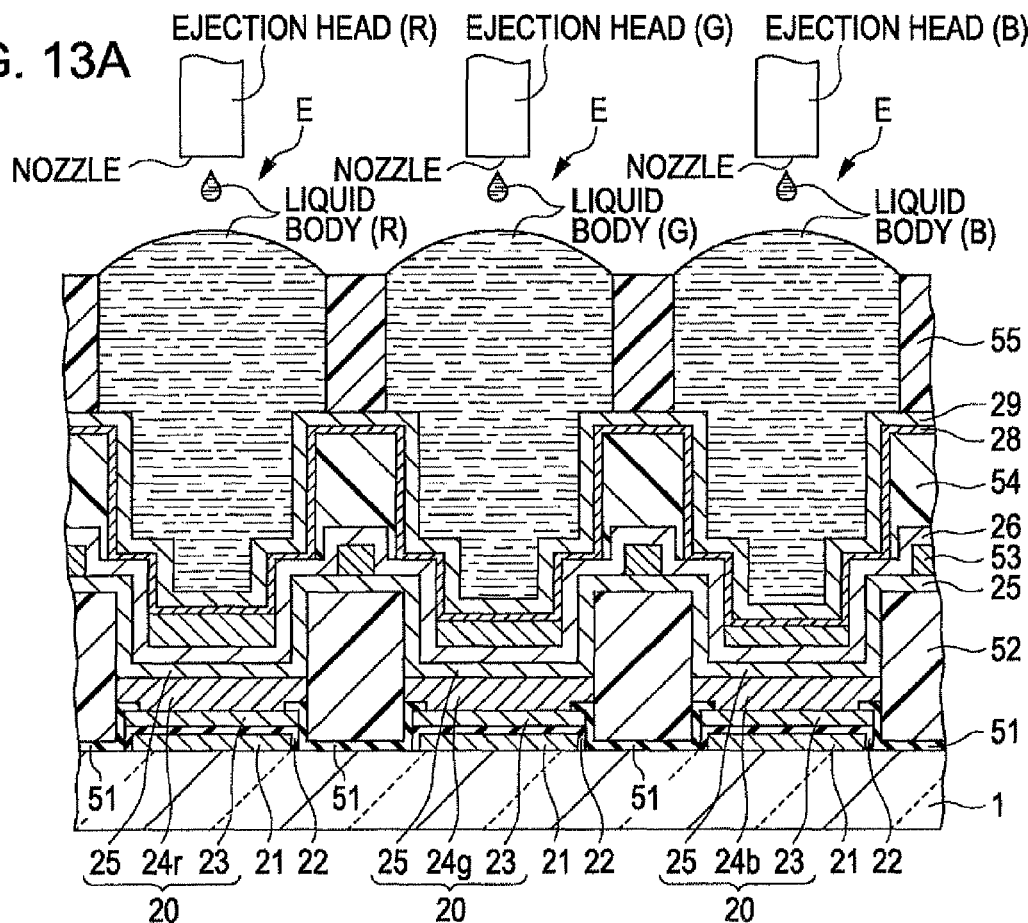
FIGS. 13A and 13B are schematic sectional views showing the method for manufacturing the organic EL device according to the second embodiment.
Figure 13B:
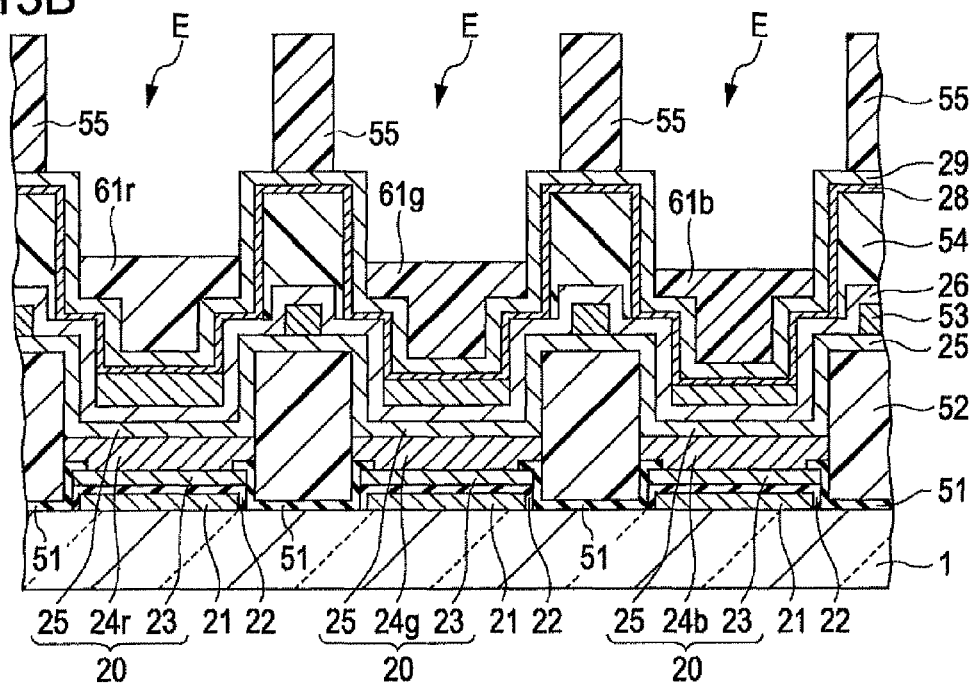

A method for manufacturing the organic EL device 80 according to this embodiment will now be described with reference to FIGS. 12, 13A, and 13B. FIG. 12 is a flowchart showing a method for manufacturing an organic EL device according to a second embodiment. FIGS. 13A and 13B are schematic sectional views showing the method for manufacturing the organic EL device according to the second embodiment.

As shown in FIG. 12, the method for manufacturing the organic EL device 80 according to this embodiment includes a reflective layer formation step (step S21) of forming a reflective layer 21 on an element substrate 1, an insulating film formation step (step S22) of forming an insulating film 22 that covers the reflective layer 21, and a pixel electrode formation step (step S23) of forming a pixel electrode 23. The method also includes a first partition wall formation step (step S24) of forming a first partition wall 51, a second partition wall formation step (step S25) of forming a second partition wall 52 on the first partition wall 51, and a functional layer formation step (step S26) of forming a functional layer 24 on the pixel electrode 23. The method also includes a negative electrode formation step (step S27) of forming a negative electrode 25 so as to cover the functional layer 24 and the second partition wall 52, a supporting electrode formation step (step S28) of forming a supporting electrode 53 of the negative electrode 25, and a first protection film formation step (step S29) of forming a protection film 26 so as to cover the negative electrode 25. Furthermore, the method includes a third partition wall formation step (step S30) of forming a third partition wall 54, an optical length adjustment layer formation step (step S31) of forming optical length adjustment layers 27r, 27g, and 27b in pixel regions E defined by the third partition wall 54, and a transflective layer formation step (step S32) of forming a transflective layer 28 so as to cover the optical length adjustment layers 27r, 27g, and 27b. Finally, the method includes a second protection film formation step (step S33) of forming a protection film 29 that covers the transflective layer 28, a fourth partition wall formation step (step S34) of forming a fourth partition wall 55 above the third partition wall 54, a colored layer formation step (step S35) of forming colored layers 61r, 61g, and 61b, and a sealing step (step S36) of bonding and sealing the element substrate 1 on which an organic EL element 20 is formed and a sealing substrate 2.

Since the steps S21 to S33 are the same as the steps S1 to S13 of the method for manufacturing the organic EL device 10 according to the first embodiment, their descriptions are omitted. The sealing step of S36 is also the same as that of S14. Thus, the steps S34 and S35, which are different from the steps of the first embodiment, will be described.

The step S34 of FIG. 12 is the fourth partition wall formation step. In the step S34, as shown in FIG. 11, the fourth partition wall 55 is formed above the third partition wall 54, that is, on the protection film 29. The method for forming the fourth partition wall 55 is the same as that of the third partition wall 54. The fourth partition wall 55 composed of an organic material is formed by applying a photosensitive polyimide resin or acrylic resin and by exposing and developing the photosensitive resin layer. The fourth partition wall 55 has a thickness (height) of about 1.5 to 2 μm. This step will continue to step S35.

The step S35 of FIG. 12 is the colored layer formation step. In the step S35, as shown in FIG. 13A, a liquid body containing the colored layer formation material is injected into different ejection heads on a color basis, and the liquid body with a color corresponding to a desired one of the pixel regions E defined by the fourth partition wall 55 is ejected by scanning the element substrate 1 with the ejection heads (R, G, and B). The required amount of the liquid body is ejected as a droplet to the pixel regions E.

Water or an organic solvent can be used as a solvent of the liquid body. About 5 to 15 wt % of the colored layer formation material relative to the solvent is dispersed. To stabilize ejection characteristics, viscosity and surface tension of the liquid body are adjusted by using an auxiliary solvent or adding a surfactant or the like. The viscosity is preferably adjusted to 3 mPa·s or more and 20 mPa·s or less, and the surface tension is preferably adjusted to 30 mN/m or more and 45 mN/m or less.

Before the three-color liquid body is ejected, a surface treatment (plasma treatment) that imparts liquid affinity and liquid repellency to the pixel regions E defined by the fourth partition wall 55 is preferably conducted.

As shown in FIG. 13B, the colored layers 61r, 61g, and 61b having a desired thickness can be formed in the pixel regions E by, for example, drying the ejected liquid body under reduced pressure to remove the solvent.

In the method for manufacturing the organic EL device 80, the chromaticity of emission light is corrected through the colored layers 61r, 61g, and 61b, and the top emission organic EL device 80 having high luminance and excellent color reproducibility can be manufactured. Furthermore, since the ink jet method is adopted, the colored layers 61r, 61g, and 61b can be formed efficiently without using an excess amount of the colored layer formation material.

Each of the colored layers 61r, 61g, and 61b is formed above the organic EL element 20 through the two protection films 26 and 29 and the optical length adjustment layer 27. Thus, even if the colored layers 61r, 61g, and 61b are formed by an ink jet method, which is a wet process, the effect on light emission of the organic EL element 20 can be reduced.

In the colored layer formation step (step S35), the three-color liquid body is not necessarily ejected. In accordance with the chromaticity of emission light from the organic EL element 20, an at least one-color liquid body may be ejected to form at least one colored layer.

Figure 14A:
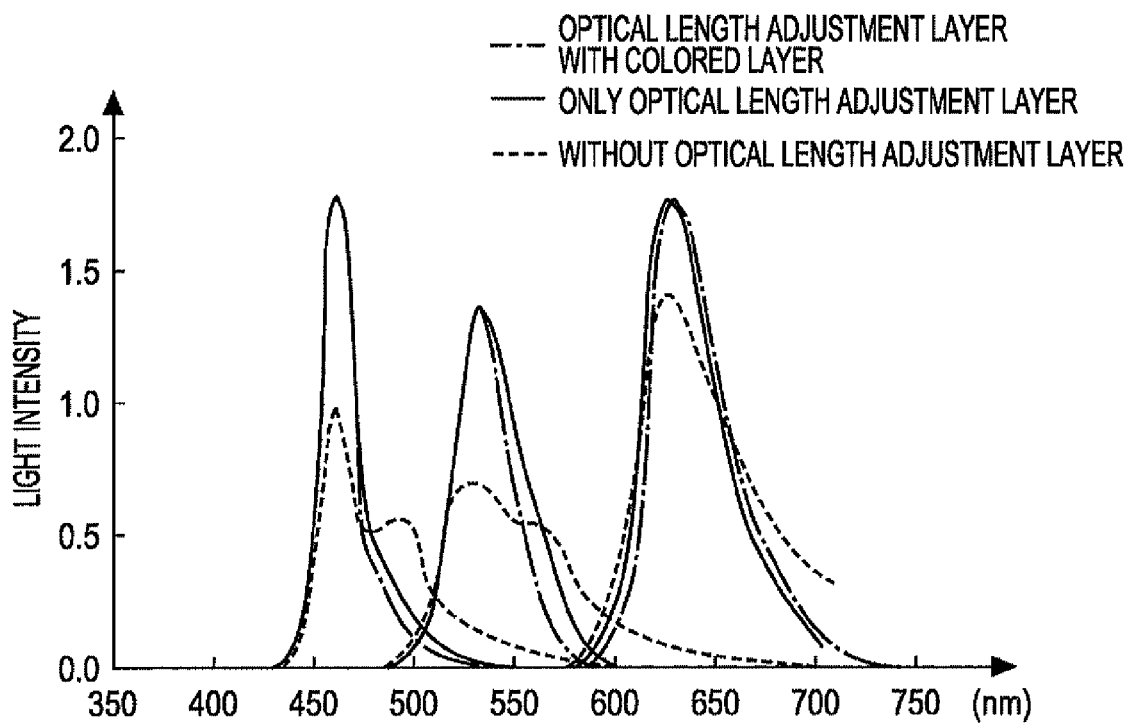
FIG. 14A is a graph showing the spectral characteristics of the organic EL device according to the second embodiment.
Figure 14B:
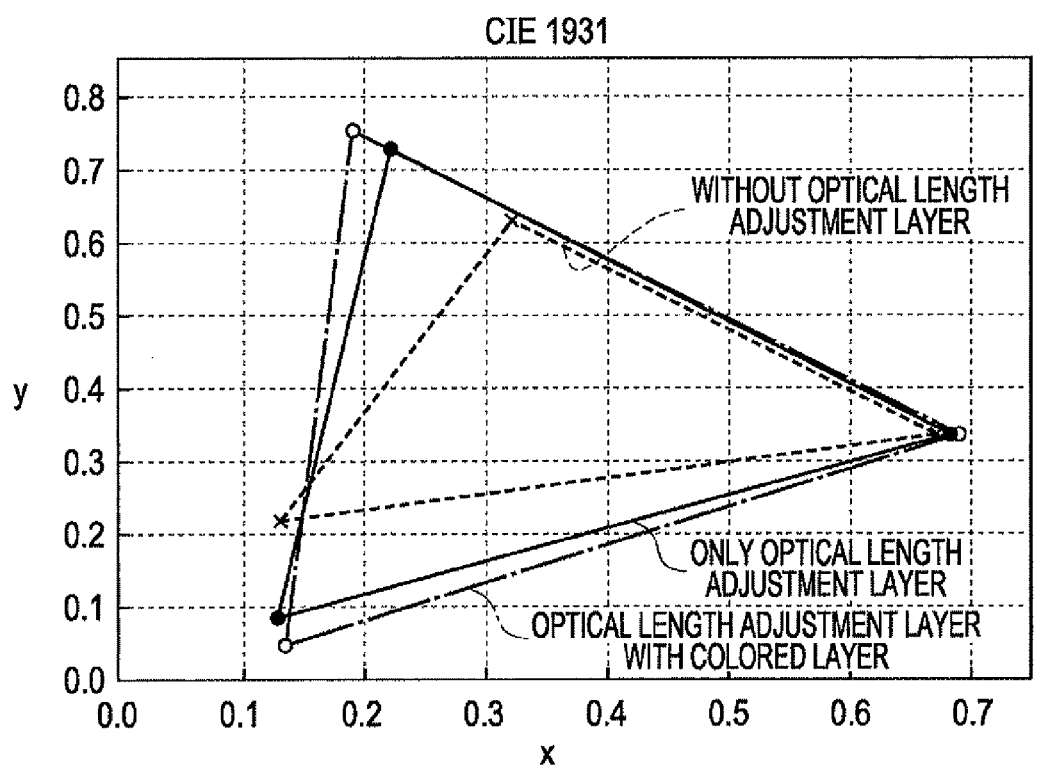
FIG. 14B is a chromaticity diagram of the organic EL device according to the second embodiment.

FIG. 14A is a graph showing the spectral characteristics of the organic EL device according to the second embodiment. FIG. 14B is a chromaticity diagram of the organic EL device according to the second embodiment. As shown in FIG. 14A, the organic EL device 80 according to this embodiment shows sharper spectral characteristics in each of the emission colors because not only the optical length adjustment layers 27r, 27g, and 27b but also the colored layers 61r, 61g, and 61b are disposed. As shown in FIG. 14B, the NTSC ratio of the organic EL device 80 is further increased to 118%. In other words, the organic EL device 80 has better color reproducibility than the organic EL device 10 according to the first embodiment.

Third Embodiment
Bottom Emission Organic EL Device

A bottom emission organic EL device will now be described with reference to FIG. 15. The same structures as those of the first embodiment are designated by the same reference numerals, and only differences are mainly described.

Figure 15:
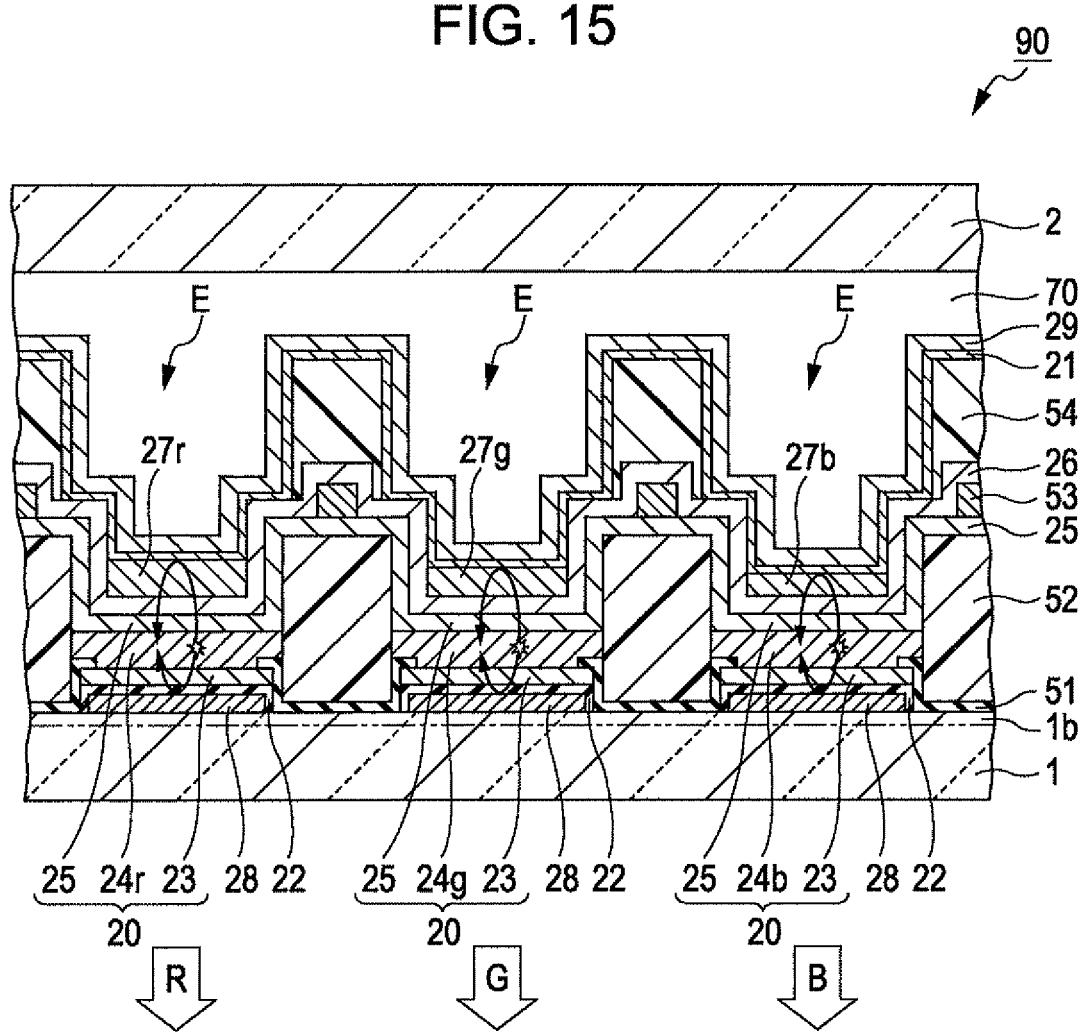
FIG. 15 is a schematic sectional view showing a structure of an organic EL device according to a third embodiment.

FIG. 15 is a schematic sectional view showing a structure of an organic EL device according to a third embodiment. As shown in FIG. 15, an organic EL device 90 according to this embodiment is a bottom emission organic EL device in which light from the organic EL element 20 is emitted to the element substrate 1 side. Compared with the organic EL device 10 according to the first embodiment, for example, a structure of an optical resonator is different.

Accordingly, a transparent glass substrate or the like is used for the element substrate 1. In contrast, the sealing substrate 2 may be a transparent glass substrate, an opaque ceramic substrate, or an opaque metal substrate made of, for example, stainless steel.

The element substrate 1 obviously includes a circuit section (not shown) for switching the organic EL element 20.

The transflective layer 28, the insulating film 22 that covers the transflective layer 28, and the pixel electrode 23 are formed on the element substrate 1 in sequence.

In each of the pixel regions E defined by the first partition wall 51, the second partition wall 52, and the third partition wall 54, the functional layer 24, the negative electrode 25, the protection film 26, the optical length adjustment layer 27, the reflective layer 21, and the protection film 29 are formed on the pixel electrode 23 in sequence.

The pixel electrode 23, the functional layer 24, and the negative electrode 25 constitute the organic EL element 20. The functional layer 24r has an organic light-emitting layer that produces a red (R) emission color, the functional layer 24g has an organic light-emitting layer that produces a green (G) emission color, and a functional layer 24b has an organic light-emitting layer that produces a blue (B) emission color. An optical resonator is formed between the transflective layer 28 and the reflective layer 21, and the optical length adjustment layers 27r, 27g, and 27b each providing optimum optical length in accordance with emission color are disposed.

The optical length adjustment layers 27r, 27g, and 27b are composed of ultrafine particles made of antimony-doped tin oxide (ATO) and having a number average particle size of 22 nm, as in the first embodiment. That is to say, the thickness of the optical length adjustment layer 27r is 150 nm, the thickness of the optical length adjustment layer 27g is 90 nm, and the thickness of the optical length adjustment layer 27b is 60 nm.

This structure can provide the bottom emission organic EL device 90 having an optimized optical resonance structure, high luminance, and excellent color reproducibility.

Method for Manufacturing Bottom Emission Organic EL Device

Figure 16:
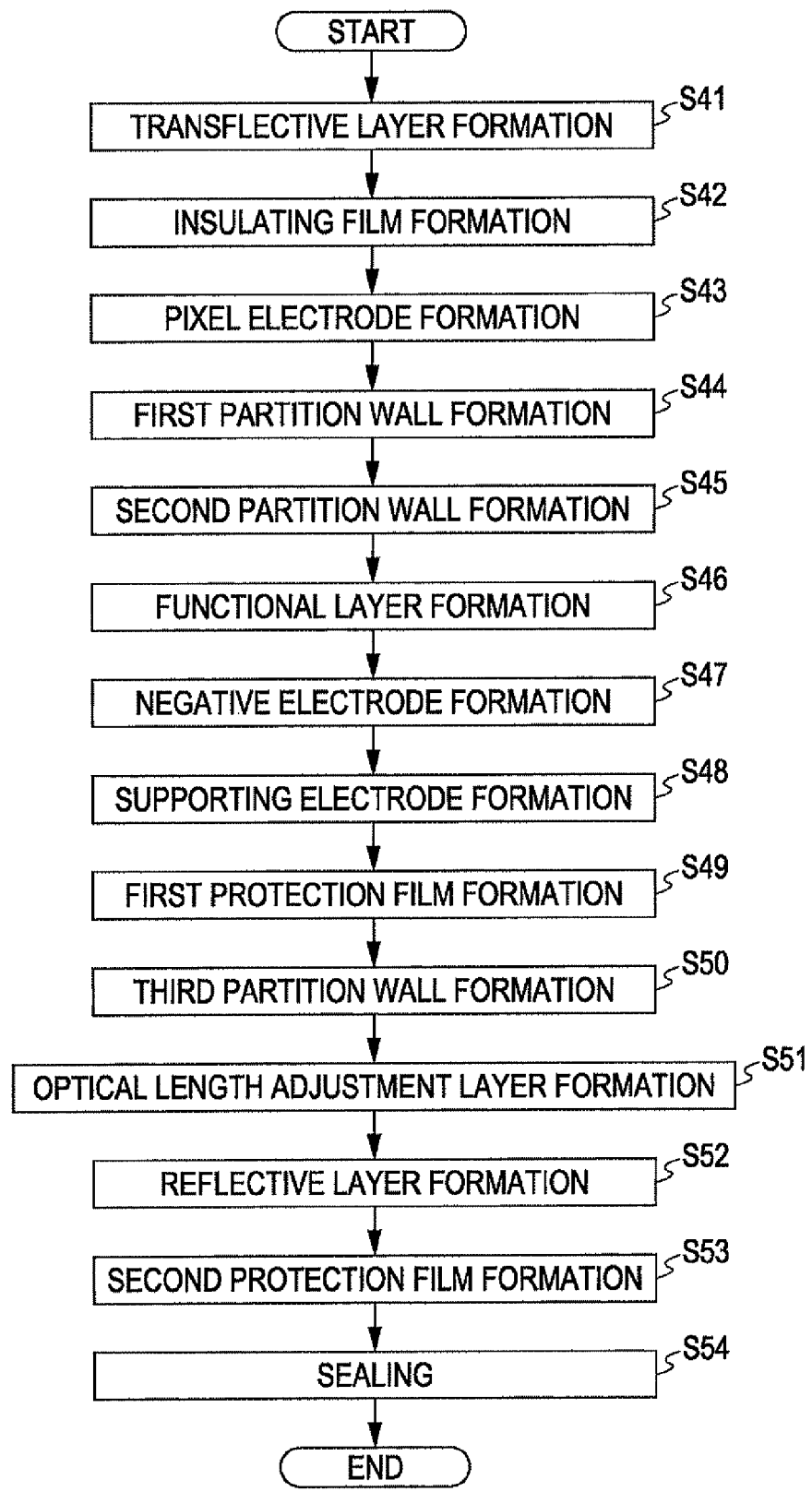
FIG. 16 is a flowchart showing a method for manufacturing the organic EL device according to the third embodiment.

A method for manufacturing the organic EL device 90 according to this embodiment will now be described with reference to FIGS. 16 and 17A to 17D. FIG. 16 is a flowchart showing a method for manufacturing an organic EL device according to a third embodiment. FIGS. 17A to 17D are schematic sectional views showing the method for manufacturing the organic EL device according to the third embodiment.

As shown in FIG. 16, the method for manufacturing the organic EL device 90 according to this embodiment includes a transflective layer formation step (step S41) of forming a transflective layer 28 on an element substrate 1, an insulating film formation step (step S42) of forming an insulating film 22 that covers the transflective layer 28, and a pixel electrode formation step (step S43) of forming a pixel electrode 23. The method also includes a first partition wall formation step (step S44) of forming a first partition wall 51, a second partition wall formation step (step S45) of forming a second partition wall 52 on the first partition wall 51, and a functional layer formation step (step S46) of forming a functional layer 24 on the pixel electrode 23. The method also includes a negative electrode formation step (step S47) of forming a negative electrode 25 that covers the functional layer 24 and the second partition wall 52, a supporting electrode formation step (step S48) of forming a supporting electrode 53 of the negative electrode 25, and a first protection film formation step (step S49) of forming a protection film 26 that covers the negative electrode 25. Furthermore, the method includes a third partition wall formation step (step S50) of forming a third partition wall 54, an optical length adjustment layer formation step (step S51) of forming optical length adjustment layers 27r, 27g, and 27b in pixel regions E defined by the third partition wall 54, a reflective layer formation step (step S52) of forming a reflective layer 21 that covers the optical length adjustment layers 27r, 27g, and 27b, a second protection film formation step (step S53) of forming a protection film 29 that covers the reflective layer 21, and a sealing step (step S54) of bonding and sealing the element substrate 1 on which an organic EL element 20 is formed and a sealing substrate 2.

The same steps as those of the method for manufacturing the organic EL device 10 according to the first embodiment are not described, and only different steps are described.

Figure 17A:
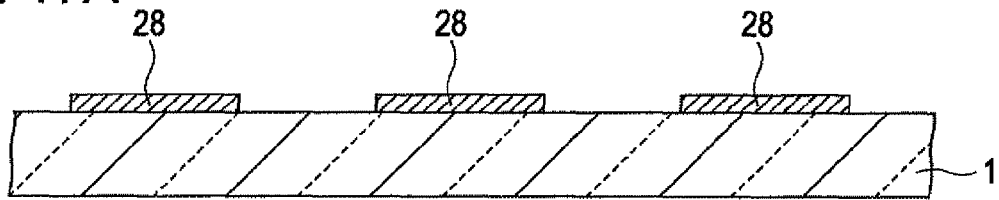
FIGS. 17A to 17D are schematic sectional views showing the method for manufacturing the organic EL device according to the third embodiment.

The step S41 of FIG. 16 is the transflective layer formation step. In the step S41, as shown in FIG. 17A, the transflective layer 28 corresponding to each of the light-emitting pixels 7 (refer to FIG. 1) is formed on a circuit section (not shown) of the element substrate 1, by mask deposition using a Mg—Ag alloy. To achieve a transmittance of 50% or more while maintaining optical reflectivity, the thickness is set to be about 10 to 20 nm. The material is not limited to the Mg—Ag alloy, and a Ca—Ag alloy may be used. This step will continue to step S42.

Figure 17B:
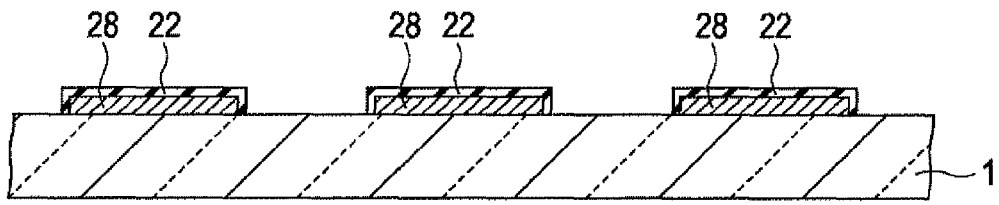

The step S42 of FIG. 16 is the insulating film formation step. In the step S42, as shown in FIG. 17B, the insulating film 22 that covers the transflective layer 28 is formed. After a silicon oxide thin film having a thickness of about 5 to 50 nm is formed by sputtering silicon oxide so as to cover the transflective layer 28, the insulating film 22 is formed by patterning the silicon oxide thin film in a desired shape through photolithography. The material is not limited to silicon oxide as described above, and silicon nitride or a compound of silicon oxide and silicon nitride may be used. This step will continue to step S43.

Figure 17C:
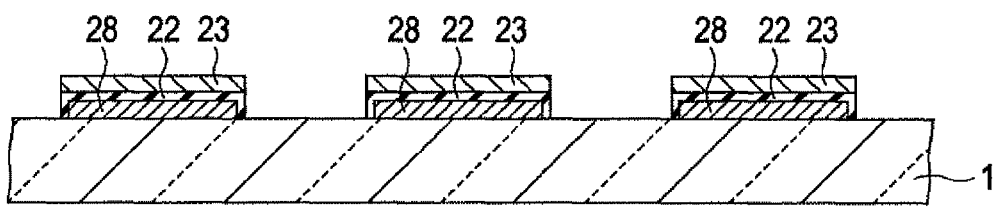

The step S43 of FIG. 16 is the pixel electrode formation step. In the step S43, as shown in FIG. 17C, the pixel electrode 23 is formed above the transflective layer 28. After a transparent conductive film having a thickness of about 10 to 20 nm is formed by sputtering ITO, the pixel electrode 23 is formed by patterning the transparent conductive film in a desired shape through photolithography. The material is not limited to ITO, and IZO may be used. The method for forming the transparent conductive film is not limited to sputtering, and vacuum deposition, CVD, or the like can be used. This step will continue to step S44.

Since the steps S44 to S51 of FIG. 16 are the same as the steps S4 to S11 of the first embodiment, their descriptions are omitted.

The step S52 of FIG. 16 is the reflective layer formation step. In the step S52, the reflective layer 21 is formed by vacuum-depositing or sputtering aluminum (Al) so as to have a thickness of about 50 to 100 nm and cover the optical length adjustment layers 27r, 27g, and 27b and the third partition wall 54. This step will continue to step S53.

Figure 17D:
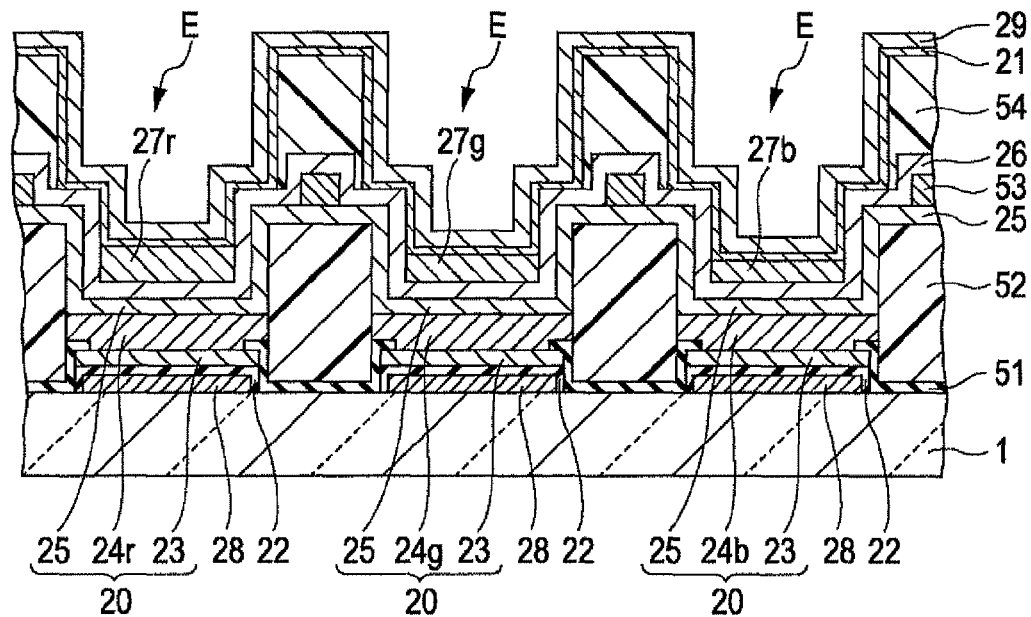

The step S53 of FIG. 16 is the second protection film formation step. In the step S53, as shown in FIG. 17D, the protection film 29 that covers the reflective layer 21 and has a thickness of about 5 to 50 nm is formed by vacuum-depositing silicon oxide. The material is not limited to silicon oxide, and silicon nitride or a compound of silicon oxide and silicon nitride may be used.

In this method for manufacturing the organic EL device 90, the bottom emission organic EL device 90 having an optimized optical resonance structure, high luminance, and excellent color reproducibility can be manufactured.

Fourth Embodiment
Electronic Apparatus

Figure 18:
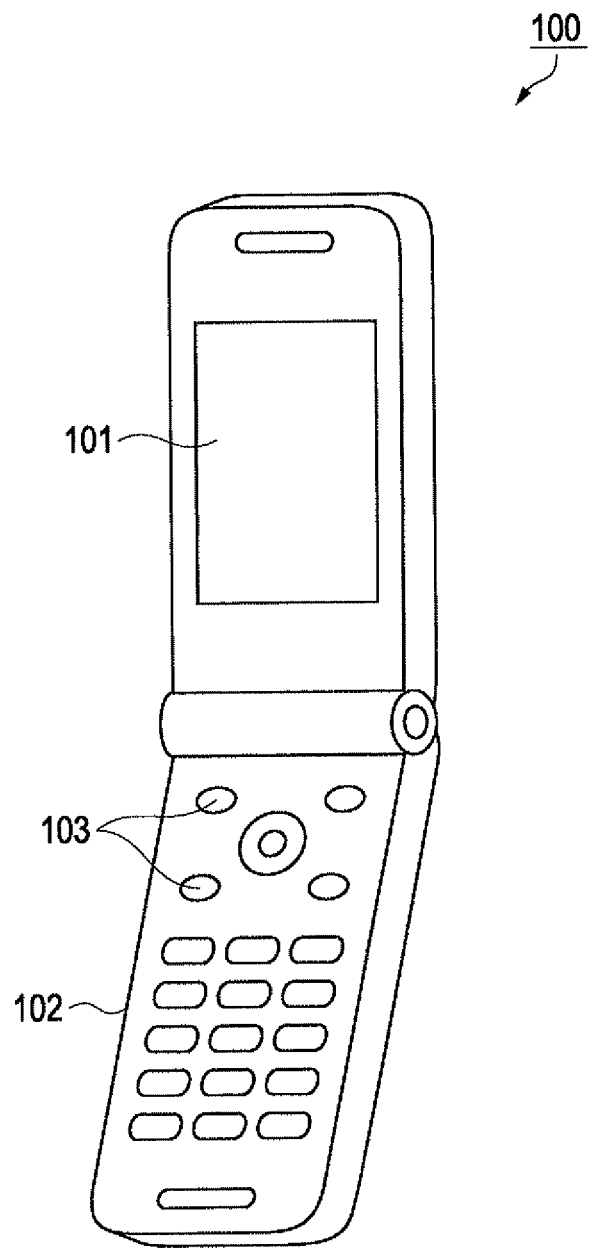
FIG. 18 is a schematic view showing a cellular phone as an electronic apparatus according to a fourth embodiment.

An electronic apparatus according to this embodiment will now be described, taking a cellular phone as an example. FIG. 18 is a schematic view showing a cellular phone as an electronic apparatus.

As shown in FIG. 18, a cellular phone 100 as an electronic apparatus according to this embodiment includes a body 102 including operation buttons 103; and a display 101 attached to the body 102 through a hinge so as to be foldable. In the display 101, one of the organic EL device 10 according to the first embodiment, the organic EL device 80 according to the second embodiment, and the organic EL device 90 according to the third embodiment is used. This can provide an attractive cellular phone 100 having high luminance and excellent color reproducibility.

In addition to the embodiment described above, various modifications can be made, and such modifications will be described.

Modification 1

Although the functional layers 24r, 24g, and 24b have substantially the same thickness in the organic EL device 10 according to the first embodiment, the invention is not limited to this. For example, the functional layers 24r, 24g, and 24b may have different thicknesses. In other words, a layer structure including the organic light-emitting layer that constitutes each of the functional layers 24r, 24g, and 24b may be changed to achieve desired emission light. Even if the functional layers 24r, 24g, and 24b have different thicknesses, this can be solved by adjusting the thicknesses of the optical length adjustment layers 27r, 27g, and 27b such that optimum optical length L is achieved. Since the optical length adjustment layers 27r, 27g, and 27b are formed by an ink jet method, the thicknesses can be easily adjusted by controlling the amount of ejecting the liquid body.

Modification 2

In the method for manufacturing the organic EL device 10 according to the first embodiment, the method for forming the hole injection/transport layer and the organic light-emitting layer included in the functional layers 24r, 24g, and 24b is not limited to the ink jet method. For example, mask deposition by which a film can be formed in a desired area may be used. Thus, the organic light-emitting layer may be formed with a low-molecular-weight organic light-emitting material.

Modification 3

Figure 19A:
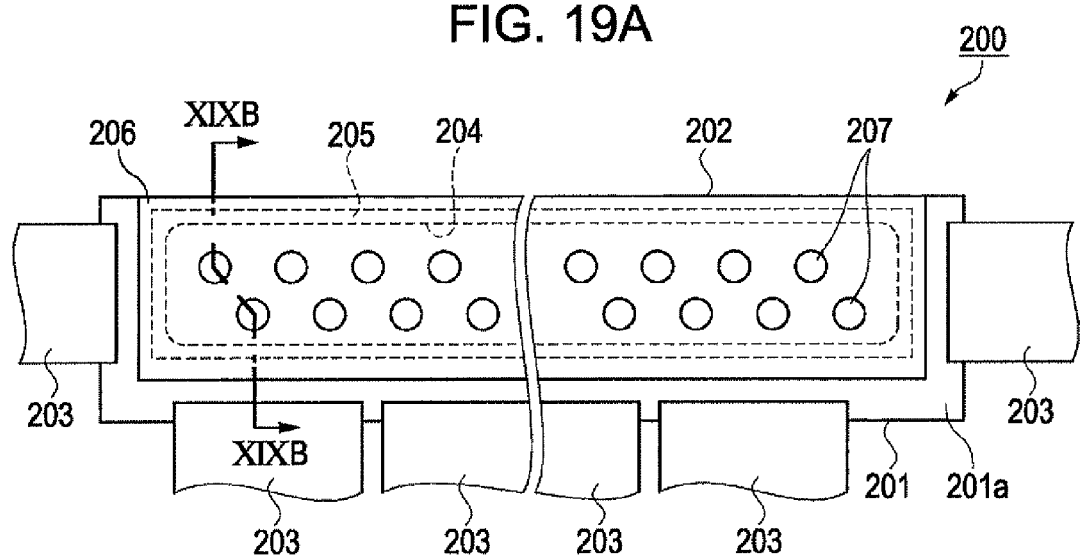
FIG. 19A is a schematic front view showing an organic EL device according to a modification.
Figure 19B:
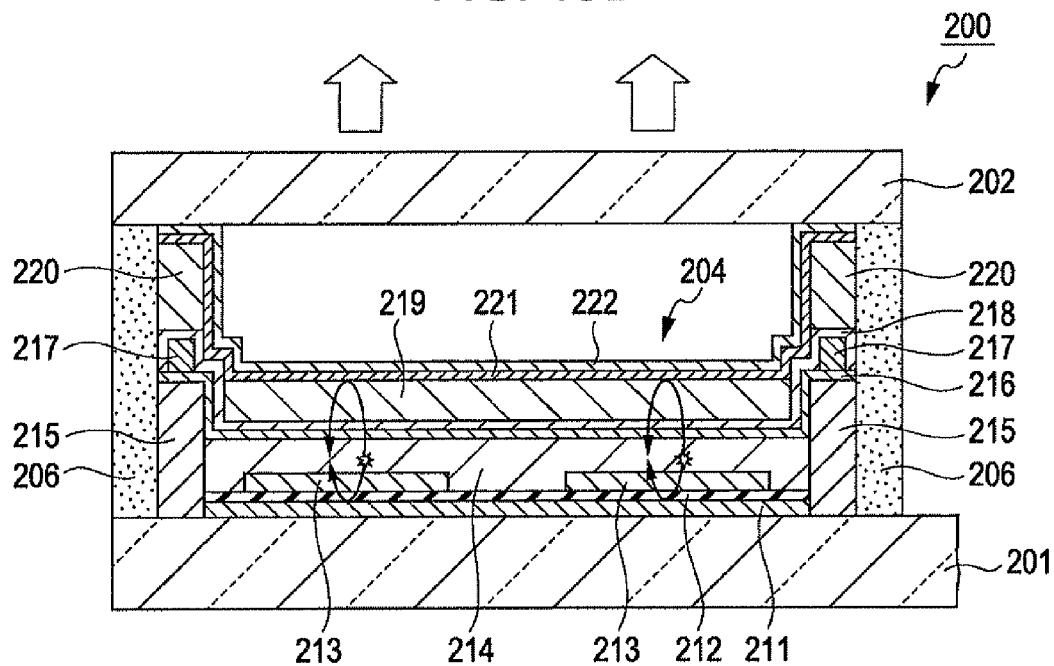
FIG. 19B is a schematic sectional view taken along line XIXB-XIXB of FIG. 19A.

The optical resonator including the optical length adjustment layers 27r, 27g, and 27b formed in accordance with emission colors does not necessarily include the organic EL element 20 that produces three-color emission light. FIG. 19A is a schematic front view showing an organic EL device according to this modification. FIG. 19B is a schematic sectional view taken along line XIXB-XIXB of FIG. 19A.

As shown in FIG. 19A, for example, an organic EL device 200 according to this modification includes an element substrate 201 in which light-emitting pixels 207 having a substantially round shape in plan view are arranged in a staggered configuration and a sealing substrate 202 bonded to and sealing the element substrate 201. An equivalent circuit of the light-emitting pixels 207, which is the same as that of the light-emitting pixels 7 shown in FIG. 2, includes an organic EL element, a thin film transistor, and a holding capacitor. Each of the light-emitting pixels 207 produces monochromatic light such as red light. A drive circuit for driving the thin film transistor is electrically connected through a relay substrate 203 mounted on a terminal section 201a.

As shown in FIG. 19B, a reflective layer 211 is formed on the element substrate 201 across a film formation region 204 to prevent emission light from leaking to the element substrate 201 side. An insulating film 212 is formed on the reflective layer 211 and a plurality of pixel electrodes 213 are formed above the reflective layer 211. A functional layer 214, a negative electrode 216, a protection film 218, an optical length adjustment layer 219, a transflective layer 221, and a protection film 222 are formed in sequence so as to cover the plurality of pixel electrodes 213. The pixel electrodes 213, the functional layer 214, and the negative electrode 216 constitute an organic EL element, and an optical resonator is formed between the reflective layer 211 and the transflective layer 221.

The film formation region 204 disposed so as to surround the plurality of pixel electrodes 213 is defined by a first partition wall 215 and a second partition wall 220 layered above the first partition wall 215. A supporting electrode 217 is disposed above the first partition wall 215. The sealing substrate 202 is bonded to the element substrate 201 through an adhesive layer 206 disposed in a frame.

This structure can provide the top emission organic EL device 200 including a plurality of organic EL elements that produce monochromatic light with high luminance. Such an organic EL device 200 can be used as, for example, an exposure light source of a photoconductive drum in an image-forming apparatus.

The method for manufacturing the organic EL device 10 according to the first embodiment can be applied to a method for manufacturing each component. Since the first partition wall 215 and the second partition wall 220 are disposed so as to surround the plurality of organic EL elements, the functional layer 214 and the optical length adjustment layer 219 can be formed by an ink jet method. That is to say, each of the plurality of organic EL elements is not necessarily partitioned by such partition walls.

Modification 4

An electronic apparatus including one of the organic EL device 10 according to the first embodiment, the organic EL device 80 according to the second embodiment, and the organic EL device 90 according to the third embodiment is not limited to the cellular phone 100. Examples of the electronic apparatus include various display devices such as personal computers, mobile information terminals, car navigation systems, and viewers.

What is claimed is:

1. A top emission organic EL device comprising:
a first light-emitting element
a second light-emitting element a first partition wall disposed so as to cover a periphery of a first pixel electrode and a second pixel electrode, the first partition wall defining a first pixel region and a second pixel region;
a second partition wall disposed on the first partition wall; and
a third partition wall disposed on the second partition wall;
the first light-emitting element including:
   a first reflective layer disposed between an element substrate and a sealing substrate;
   the first pixel electrode disposed between the first reflective layer and the sealing layer and the first pixel electrode being transparent;
   a first functional layer disposed between the first reflective layer and the sealing layer, the first functional layer including a first organic light-emitting layer;
   a negative electrode disposed between the first functional layer and the sealing layer;
   a first optical length adjustment layer disposed between the negative electrode and the sealing layer;
   a transflective layer disposed between the first optical length adjustment layer and the sealing layer;
   the first optical length adjustment layer being formed so as to resonate to a first wave length of a first light between the first reflective layer and the transflective layer, the first light being emitted from the first organic light-emitting layer;
the second light-emitting element including:
   a second reflective layer disposed between an element substrate and a sealing substrate;
   the second pixel electrode disposed between the second reflective layer and the sealing layer and the second pixel electrode being transparent;
   a second functional layer disposed between the second pixel electrode and the sealing layer;
   the negative electrode disposed between the second functional layer and the sealing layer;
   a second optical length adjustment layer disposed between the negative electrode and the sealing layer; and
   the transflective layer disposed between the second optical length adjustment layer and the sealing layer;
   the second optical length adjustment layer being formed so as to resonate to a second wave length of a second light between the second reflective layer and the transflective layer, the second light being emitted from the second organic light-emitting layer.

2. The organic EL device according to claim 1, further comprising:
   a first color filter element corresponding to the first light, the first filter element being formed on the transflective layer; and
   a second color filter element corresponding to the second light, the second filter element being formed on the transflective layer.

3. The organic EL device according to claim 2, further comprising:
   a protection film having gas impermeability, the protection film being disposed between the transflective layer and the first and second color filter elements.

4. The organic EL device according to claim 1, wherein
   at least the first optical length adjustment layer and the second optical length adjustment layer are composed of an optically transparent ultrafine particle or an optically transparent polymer film containing the optically transparent ultrafine particle.

5. The organic EL device according to claim 4, wherein
   a particle size of the ultrafine particle is selected such that light undergoes Rayleigh scattering in the first and second optical length adjustment layers.

6. The organic EL device according to claim 4, further comprising:
   a protection film having gas impermeability, the protection film being disposed between the negative electrode and the first and second optical length adjustment layers.

7. The organic EL device according to claim 1, further comprising:
   a supporting electrode disposed on the second partition wall, wherein
   the negative electrode is formed so as to cover the partition wall and the first and second pixel regions, and
   the supporting electrode has lower sheet resistance than the negative electrode.

8. An electronic apparatus comprising the organic EL device according to claim 1.

9. A method for manufacturing a top emission organic EL device, the method comprising:
   forming a first reflective layer and a second reflective layer on a substrate;
   forming a first pixel electrode on the first reflective layer and a second pixel electrode on the second reflective layer, the first and the second pixel electrodes being transparent;
   forming a first partition wall so as to cover a periphery of the first and second pixel electrodes, the first partition wall defining a first pixel region and a second pixel region;
   forming a second partition wall on the first partition wall;
   forming a first functional layer on the first pixel electrode of the first pixel region, the first functional layer including a first organic light-emitting layer;
   forming a second functional layer on the second pixel electrode of the second pixel region, the second functional layer including a second organic light-emitting layer;
   forming a negative electrode so as to cover: the second partition wall, the first functional layer and the second functional layer;
   forming a third partition wall on the second partition wall, the third partition wall having a first area formed as a first optical length adjustment layer and a second area formed as a second optical adjustment layer;
   forming a first optical length adjustment layer in the first area by an ink jet method;
   forming a second optical length adjustment layer in the second area by the ink jet method; and
   forming a transflective layer above the first optical length adjustment layer and the second optical length adjustment layer, wherein
   the first optical length adjustment layer being formed so as to resonate to a first wave length of a first light between the first reflective layer and the transflective layer, the first light being emitted from the first organic light-emitting layer, and
   the second optical length adjustment layer being formed so as to resonate to a second wave length of a second light between the second reflective layer and the transflective layer, the second light being emitted from the second organic light-emitting layer.

10. The method for manufacturing the organic EL device according to claim 9, further comprising:
    ejecting a first color liquid body containing a first filter element formation material in the first pixel region;

ejecting a second color liquid body containing a second filter element formation material in the second pixel region; and forming the first filter element and the second filter element on the transflective layer by solidifying the ejected liquid body.

11. The method for manufacturing the organic EL device according to claim 10, further comprising:

forming a protection film having gas impermeability between the transflective layer and the first and second filter elements.

12. The method for manufacturing the organic EL device according to claim 9, wherein the first functional layer and the second functional layer formation step includes:

ejecting a liquid body containing an organic light-emitting layer formation material in the first and second pixel regions, and forming the first and second organic light-emitting layers by solidifying the ejected liquid body.

13. The method for manufacturing the organic EL device according to claim 9, wherein:

the first and second optical length adjustment layer formation step includes:

ejecting a liquid body containing an optically transparent ultrafine particle in the first and second pixel regions, and forming the first and second optical length adjustment layers by solidifying the ejected liquid body.

14. The method for manufacturing the organic EL device according to claim 13, further comprising:

forming a protection film having gas impermeability between the negative electrode and the first and second optical length adjustment layers.

15. The method for manufacturing the organic EL device according to claim 9, further comprising:

forming a supporting electrode having lower sheet resistance than the negative electrode on the second partition wall, wherein the negative electrode is formed so as to cover the second partition wall and the first and second pixel regions.

16. The method for manufacturing the organic EL device according to claim 9, wherein:

the ink jet method includes ejecting a liquid body as a droplet from a nozzle of an ejection head of a recording apparatus.

* * * * *